United States Patent [19]

Kunii et al.

[11] Patent Number: 5,412,493
[45] Date of Patent: May 2, 1995

[54] LIQUID CRYSTAL DISPLAY DEVICE HAVING LDD STRUCTURE TYPE THIN FILM TRANSISTORS CONNECTED IN SERIES

[75] Inventors: Masafumi Kunii; Yuji Hayashi, both of Kanagawa, Japan

[73] Assignee: Sony Corporation, Tokyo, Japan

[21] Appl. No.: 125,802

[22] Filed: Sep. 24, 1993

[30] Foreign Application Priority Data

Sep. 25, 1992 [JP] Japan .................................. 4-280462
Jan. 14, 1993 [JP] Japan .................................. 5-021996

[51] Int. Cl.$^6$ ...................... G02F 1/136; H01L 29/76
[52] U.S. Cl. ................................. 359/59; 257/72; 257/344; 257/408
[58] Field of Search ........................ 359/58, 59; 345/92, 345/93; 257/66, 72, 344, 408

[56] References Cited

U.S. PATENT DOCUMENTS

| | | | |
|---|---|---|---|
| 4,623,908 | 11/1986 | Oshima et al. | 257/66 |
| 4,945,067 | 7/1990 | Huang | 257/347 |
| 4,948,231 | 4/1990 | Aoki et al. | 359/67 |
| 5,198,379 | 3/1993 | Adan | 437/41 |
| 5,250,835 | 10/1993 | Izawa | 257/408 |
| 5,283,455 | 2/1994 | Inoue et al. | 257/344 |

FOREIGN PATENT DOCUMENTS

| | | |
|---|---|---|
| 58-171860 | 10/1983 | Japan . |
| 58-180063 | 10/1983 | Japan . |
| 3-38755 | 6/1991 | Japan . |

OTHER PUBLICATIONS

Matsueda et al "Defect-Free Active-Matrix LCD with Redundant Poly-Si TFT circuit" SID 89 Digest-May 1989-pp. 238-241.

*Primary Examiner*—William L. Sikes
*Assistant Examiner*—Tai V. Duong
*Attorney, Agent, or Firm*—Hill, Steadman & Simpson

[57] ABSTRACT

A thin film transistor structure for a liquid crystal display device of the active matrix type, wherein leak current is suppressed to stabilize the threshold voltage and the dispersion in the gate capacitance coupling and the channel length are minimized, is disclosed. The liquid crystal display device comprises a substrate having picture element electrodes arranged in a matrix and switching elements for driving the picture element electrodes, another substrate having opposing electrodes thereon and opposed to the former substrate, and a liquid crystal layer held between the substrates. Each switching element has a multi-gate structure wherein two thin film transistors are connected in series and gate electrodes are electrically connected to each other. Each thin film transistor has a lightly doped drain structure wherein a low density impurity region of the same conductivity type as that of a source region or a drain region is provided at least between the source or drain region and a channel region. At least one of a plurality of such low density impurity regions may have a length or a density different from that of the other low density impurity regions so as to assure sufficient on-current while suppressing the leak current.

19 Claims, 22 Drawing Sheets

F I G. 1
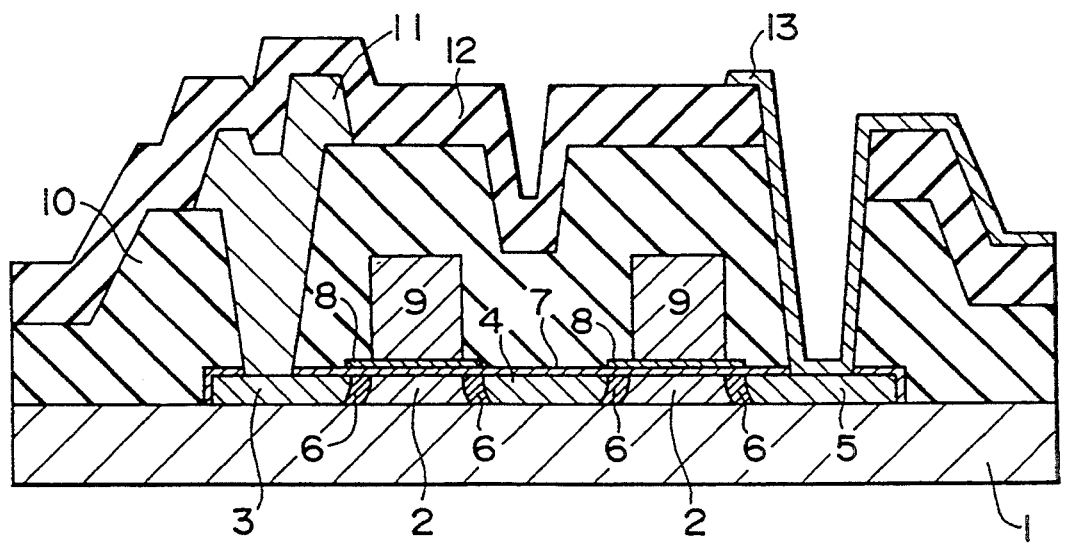
F I G. 2
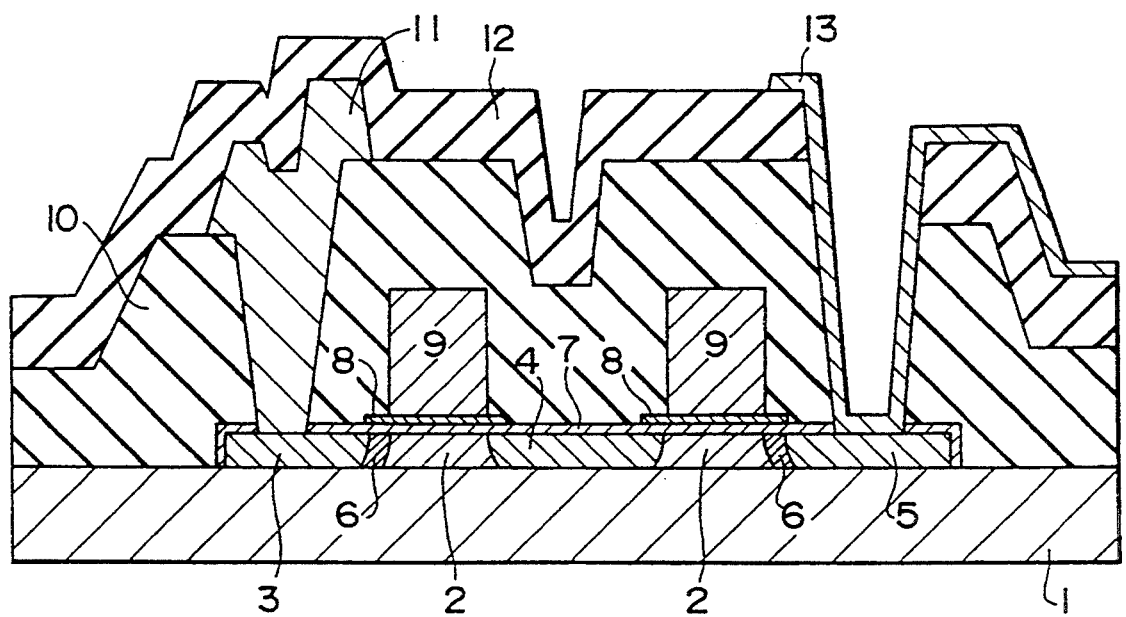

LIQUID CRYSTAL DISPLAY DEVICE HAVING LDD STRUCTURE TYPE THIN FILM TRANSISTORS CONNECTED IN SERIES

BACKGROUND OF THE INVENTION

1. Field of the Invention

This invention relates to a liquid crystal display device of the active matrix type, and more particularly to the structure of a thin film transistor formed as an active element in an integrated circuit for use with a liquid crystal display device of the active matrix type.

2. Description of the Related Art

Thin film transistors (TFTs) have been developed remarkably in recent years since they can be applied to liquid crystal display devices of the active matrix type, image sensors of the closely contacting type and various other applications. Attention is paid particularly to polycrystalline silicon as a thin film material since thin film transistors constituting a peripheral driver circuit can be formed on a same substrate of an integrated circuit in addition to thin film transistors constituting a display section and a sensor section.

For thin film transistors which are used as switching elements for switching picture elements of a liquid crystal display device of the active matrix type on and off, various structures have conventionally been proposed and put into practical use particularly in order to minimize the leak current which causes a defect of a bright point of a picture element. For example, a thin film transistor of a lightly doped drain structure (LDD) has been developed and is disclosed in Japanese Patent Publication Application No. Heisei 3-38755. The thin film transistor of the lightly doped drain structure has, between end portions of a channel region and a drain region, a low density impurity region thinner than the drain region. The lightly doped drain structure is applied to circuit elements of a liquid crystal display device of the active matrix type and like devices since it is advantageous in that the concentration of an electric field at the end portion of the drain region can be alleviated and it has a leak current suppressing effect.

In order to make the background of the present invention clear, a conventional lightly doped drain structure will be described briefly with reference to FIG. 12. A polycrystalline silicon film is formed in an island-like pattern on the surface of a quartz substrate 1. The polycrystalline silicon film has a channel region 2, a source region 3, and a drain region 5 formed on the opposite sides of the channel region 2. Such a low density impurity region or lightly doped drain region 6 as described above is formed at each of the opposite end portions of the channel region 2. A gate electrode 9 is formed in a pattern on the polycrystalline silicon film with a gate oxide film 7 and a gate nitride film 8 interposed therebetween, thereby constituting a thin film transistor. A first interlayer insulator film 10 is formed on the thin film transistor. A wiring electrode 11 is formed in a pattern on the first interlayer insulator film 10 and is electrically connected to the source region 3 by way of a contact hole. A picture element electrode 13 is formed in a pattern on the thin film transistor with a second interlayer insulator film 12 interposed therebetween and is electrically connected to the drain region 5 by way of a contact hole.

A thin film transistor of a so-called multi-gate structure which includes two or more gate electrodes is conventionally known as another measure to minimize the leak current of a thin film transistor. Thin film transistors of the type mentioned are disclosed, for example, in Japanese Patent Laid-Open Application No. Showa 58-171860 and Japanese Patent Laid-Open Application No. Showa 58-180063. In order to facilitate understanding of the present invention, a thin film transistor of the multi-gate structure will be described briefly with reference to FIG. 13. A polycrystalline silicon film is formed in an island-like pattern on the surface of a quartz substrate 1. The polycrystalline silicon film has a pair of channel regions 2 formed in a mutually separated condition from each other therein. The channel regions 2 are connected to each other by way of a source/drain region 4. A source region 3 is formed at an end portion of one of the channel regions 2 remote from the source/drain region 4 while a drain region 5 is formed at an end portion of the other channel region 2 remote from the source/drain region 4. A pair of gate electrodes 9 are formed in a predetermined pattern in register with the channel regions 2 with a gate oxide film 7 interposed therebetween. A wiring electrode 11 is formed in a pattern on the polycrystalline silicon film with a first interlayer insulator film 10 interposed therebetween and is electrically connected to the source region 3 by way of a contact hole formed in the first interlayer insulator film 10. A picture electrode 13 is formed in a pattern on the polycrystalline silicon film with a second interlayer insulator film 12 interposed therebetween and is electrically connected to the drain region 5 by way of another contact hole. The multi-gate thin film transistor thus includes, represented in an equivalent circuit, a plurality of thin film transistors connected in series. Since the leak current depends upon that one of the thin film transistors which is lowest in off-current value, the leak current can be suppressed. Therefore, thin film transistors of the multi-gate structure are also applied to switching elements for picture elements of a liquid crystal display device of the active matrix type or a like device.

FIG. 14 is an equivalent circuit diagram showing a portion for a picture element of a liquid crystal display device of the active matrix type which employs thin film transistors of the multi-gate structure. Referring to FIG. 14, the liquid crystal display device includes switching elements TFT1 to TFTn connected in series. The gate electrodes of the switching elements TFT1 to TFTn are connected commonly to a gate line. An end portion of the source region of the thin thin film transistor TFT1 is connected to a signal line while an end portion of the drain region of the thin film transistor TFTn drives a liquid crystal display element by way of a picture element electrode. An auxiliary capacitor is connected in parallel to the liquid crystal display element.

In the conventional lightly doped drain thin film transistor structure, since the dose amount of an impurity in the lightly doped drain region is approximately $1 \times 10^{12}$ to $1 \times 10^{13}/cm^2$, when ions of an impurity are implanted into the polycrystalline silicon film, the specific resistance value of the polycrystalline silicon film is varied by a great amount by a small variation of the dose amount. Consequently, the resistance of the lightly doped drain region is liable to vary, which is a cause of a dispersion in the leak current of lightly doped drain thin film transistors. In a thin film transistor whose leak current is high, particularly when the ambient temperature is high, for example, 50° to 80° C., the leak current increases exponentially with respect to the temperature. Consequently, there is a subject to be solved in that a so-called high temperature bright point defect appears on the screen of the liquid crystal display device. Further, since the activation ratio of impurity ions in an active region is varied by a small difference in the crystalline property of a polycrystalline silicon film used for an active region of a thin film transistor, there is another subject in that the threshold voltage (Vth) varies among thin film transistors. In addition, since thin film transistors have a dispersion in capacitance coupling between the gate capacitance and the auxiliary capacitance, bright line defects in the form of a thin string sometimes appear on the screen of a liquid crystal display device of the active matrix type, which is a further subject to be solved. Such bright line defects arising from the capacitance coupling appear significantly particularly when a signal charge is written into picture element electrodes while the drain voltage is comparatively low.

On the other hand, in the conventional thin film transistor of the multi-gate structure, since the impurity doped in the source region and the drain region is diffused in a horizontal direction, there is a subject to be solved in that the length of the channel, for example, of an n-channel thin film transistor in which p+ ions are doped cannot be reduced smaller than 5 μm. If the channel length is reduced in this manner, then the effective channel length becomes excessively short due to the dispersion of the impurity in a horizontal direction, and consequently, the leak current increases remarkably. Therefore, miniaturization of thin film transistors is difficult with the conventional multi-gate structure, which is an obstacle to enhancement of the resolution of a liquid crystal display device of the active matrix type. In addition, a liquid crystal display device in which thin film transistors of the conventional multi-gate structure are employed suffers very frequently from high temperature bright point defects similarly to a liquid crystal display device in which thin film transistors of the lightly doped drain structure are employed.

Furthermore, even where a thin film transistor has the lightly doped drain structure, it cannot completely suppress the occurrence of a bright point defect picture element caused by leakage of signal charge from the thin film transistor during holding of the signal charge. Particularly at a high temperature, for example, 55° C., at which the leak level is generally high, point defect picture elements which are put into a blinking condition appear very frequently. Thus, an analysis has been made of the phenomenon. The analysis has proved that point defects of picture elements relate to ac driving of the liquid crystal and depend upon the polarity of the applied voltage and leak current flows between the source and the drain. More particularly, during holding of signal charge of the positive polarity, a high electric field is applied continuously between the gate electrode and the picture element electrode, and consequently, the leak current flowing associated with a localized state is much higher than that during holding of a signal charge of the negative polarity so that the image signal level of a high potential cannot be held sufficiently during holding of the positive polarity, resulting in loss of the balance of ac driving of the liquid crystal. Consequently, there is a subject to be solved in that blinking point defect picture elements appear very frequently.

SUMMARY OF THE INVENTION

It is an object of the present invention to provide a thin film transistor structure for a liquid crystal display device of the active matrix type which is low in leak current and is easy to control the threshold voltage characteristic.

It is another object of the present invention to provide a thin film transistor structure for a liquid crystal display device of the active matrix type which allows stable ac driving without being influenced by gate capacitance coupling.

It is a further object of the present invention to provide a thin film transistor structure for a liquid crystal display device of the active matrix type which can be formed in a minimized size.

In order to attain the objects described above, according to the present invention, there is provided a liquid crystal display device, which comprises a first substrate, a plurality of picture element electrodes arranged in a matrix on the first substrate, each picture element electrode being associated with a switching element which comprises a plurality of thin film transistors connected in series, gate electrodes of the plurality of thin film transistors being electrically connected to each other, the thin film transistors having lightly doped regions between a source/drain region and a channel region, the lightly doped region being of the same conductivity type to that of the source/drain region, a second substrate opposed to the first substrate and having an electrode on an inner surface thereof, and a liquid crystal layer disposed between the first and second substrates.

Preferably, the thin film transistors have a first lightly doped region between source and channel regions, and a second lightly doped region between channel and drain regions.

Preferably, the switching element comprises a pair of thin film transistors connected in series. In this instance, preferably one of the thin film transistors has a first lightly doped region only between source and channel regions, and the other thin film transistor has a second lightly doped region only between drain and channel regions. Or preferably, the pair of thin film transistors have two lightly doped regions at both ends of the source/drain region. Alternatively, the pair of thin film transistors may have a first lightly doped region at the end of the drain region and a second lightly doped region at the end of the drain side of source/drain region.

Preferably, each thin film transistor has a channel length no longer than 5 μm.

Preferably, the plurality of thin film transistors have a plurality of lightly doped regions, at least one of which has a different length than that of another lightly doped region. In this instance, the lightly doped region having a different length may be a region arranged the closest to the picture element electrode and be the region having a length longer than another regions.

Preferably, the plurality of thin film transistors have a plurality of lightly doped regions, at least one of which has a different doping characteristic than that of another lightly doped regions. In this instance, the lightly doped region having a different doping characteristic may be a region arranged the closest to the picture element electrode and be the region having a lower doping characteristic than another lightly doped regions.

With the liquid crystal display device, the thin film transistors for a picture element switching element have a multi-gate structure and a lightly doped drain structure. By a combination of the two structures, individual advantages of both structures are made the most of, and besides, the remarkable synergetic effect that individual disadvantages of both structures are canceled is achieved. In particular, even if the thin film transistor is formed in a smaller size, the leak current can be suppressed to be low and the dispersion in the threshold voltage (Vth) and the gate capacitance coupling can be reduced, and the channel length can be reduced. Consequently, a liquid crystal display device of the active matrix having a high resolution and a high aperture ratio can be realized. Particularly, with the thin film transistor for a picture element switching element having a combination of the multi-gate structure and the lightly doped drain structure, by making the length or the density of one of the lightly doped drain regions which is located adjacent the picture element electrode different from that of the remaining lightly doped drain regions, the concentration of an electric field in the channel region can be suppressed to be low during holding of the positive polarity of the potential of the picture element, and consequently, the leak current associated with localized state can be suppressed. Further, since high a driving current or on-current can be obtained while suppressing the leak current to be low, the present invention can contribute remarkably to the enhancement of the performance of a liquid crystal display device of the active matrix type. Further, since the degree of freedom in designing a thin film transistor is increased, the present invention contributes also to the enhancement of the aperture ratio of a liquid crystal display device. In this manner, the present invention contributes remarkably to the enhancement of the performance of a liquid crystal display device of the active matrix type.

The above and other objects, features and advantages of the present invention will become apparent from the following description and the appended claims, taken in conjunction with the accompanying drawings in which like parts or elements are denoted by like reference characters.

BRIEF DESCRIPTION OF THE DRAWINGS

FIG. 1 is a schematic partial sectional view of a thin film transistor of a liquid crystal display device of the active matrix type showing a first preferred embodiment of the present invention;

FIG. 2 is a similar view but showing a modification to the thin film transistor of FIG. 1;

DETAILED DESCRIPTION OF THE PREFERRED EMBODIMENTS

Figure 3:
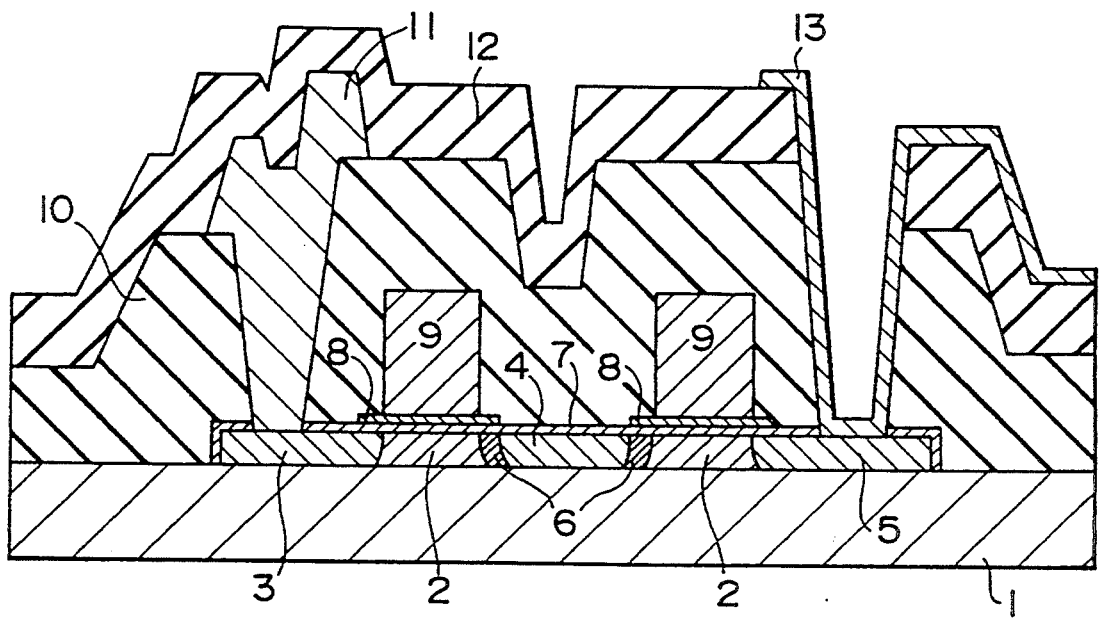
FIG. 3 is a similar view but showing another modification to the thin film transistor of FIG. 1.

Referring first to FIG. 1, there is shown a liquid crystal display device of the active matrix type to which the present invention is applied, and more particularly, a thin film transistor and associated elements of part of the liquid crystal display device is shown. The thin film transistor is an n-channel transistor and constitutes a switching element for driving a picture element of the liquid crystal display device of the active matrix type. The thin film transistor includes an insulator substrate such as, for example, a quartz substrate 1, and a polycrystalline semiconductor layer such as, for example, a polycrystalline silicon layer, formed in a pattern on the quartz substrate 1. The polycrystalline silicon film has formed therein a source region 3, a source/drain region 4, a drain region 5, and a pair of channel regions 2 which are located between the source region 3 and the source/drain region 4 and between the source/drain region 4 and the drain region 5. A total of four low density impurity regions or lightly doped drain regions 6 of the same conductivity type as that of the source region 3 and the drain region 5 are between the source region 3 and source/drain region 4 and one of the channel regions 2 between the source region 3 and the source/drain region 4 and between the source/drain region 4 and drain region 5 and the other channel region 2 between the source/drain region 4 and the drain region 5. A gate electrode 9 is formed above each of the channel regions 2 with a gate insulator film interposed therebetween. The gate insulator film has a two-layer structure including a gate oxide film 7 and a gate nitride film 8.

The quartz substrate 1 is covered with a first interlayer insulator film 10 made of a PSG or a like material. A wiring electrode 11 made of aluminum or some other suitable material is electrically connected to the source region 3 by way of a contact hole formed in the first interlayer insulator film 10. Similarly, a picture element electrode 13 made of a transparent conductive material such as an ITO is electrically connected to the drain region 5 by way of another contact hole formed in the first interlayer insulator film 10. The picture element electrode 13 is formed on a second interlayer insulator film 12 made of a PSG or a like material.

A liquid crystal display device of the active matrix type of the first embodiment described above was manufactured actually, and several investigations have been made for the liquid crystal display device. Subsequently, functional advantages of the thin film transistor structure employed in the liquid crystal display device will be described in detail below with reference to FIG. 1. First, a leak current suppressing function will be described. Generally, a polycrystalline silicon film which provides an active region of a thin film transistor exhibits high leak current since it is higher in defect density than single crystalline silicon. Therefore, hydrogen diffusion processing is normally performed for a polycrystalline silicon film to decrease the defect density to reduce the leak current of the thin film transistor. As the hydrogen diffusion proceeds, the defect level of the polycrystalline silicon decreases and the energy barrier of the grain boundary becomes low, and consequently, the resistance of the lightly doped drain region decreases. Since the resistance of the lightly doped drain region is influenced significantly by the degree of the hydrogen diffusion, depending upon the condition of the hydrogen diffusion, the resistance of the lightly doped drain region varies significantly among different thin film transistors in a same wafer. As a result, abnormal thin film transistors of high leak current conventionally appear at a certain statical probability. In contrast, with a lightly doped drain thin film transistor structure of the multi-gate structure according to the present invention, the effective value of leak current depends upon that one of a plurality of thin film transistors connected in series in an equivalent circuit that exhibits the lowest off current. Consequently, the variation in leak current arising from a difference in degree of the hydrogen diffusion decreased significantly.

Subsequently, a threshold voltage stabilization function will be described. The degree of the hydrogen diffusion has an influence not only upon the leak current but also upon the threshold voltage Vth of the thin film transistor. If the degree of the hydrogen diffusion proceeds excessively, then the threshold voltage Vth of the thin film transistor drops so low that current may flow even when the gate is off. Therefore, a picture element defect called threshold voltage bright point is produced and makes a problem with a conventional thin film transistor. In contrast, with a lightly doped drain thin film transistor of the multi-gate structure of the present embodiment, the value of the threshold voltage Vth depends upon that one of a plurality of thin film transistors connected in series in an equivalent circuit which exhibits the highest threshold voltage Vth. As a result, the variation in threshold voltage Vth was suppressed, and also the probability of a threshold voltage brightness point defect was reduced significantly.

Subsequently, the lightly doped drain thin film transistor of the multi-gate structure was improved also in dispersion in gate capacitance coupling, which is one of the problems of conventional lightly doped drain thin film transistors of the single gate structure. Since the dispersion in gate capacitance among lightly doped drain thin film transistors of the multi-gate structure of the present embodiment is smaller than the dispersion in gate capacitance of lightly doped drain thin film transistors of the single gate structure, the degree in the brightness line defect was reduced comparing with conventional lightly doped drain thin film transistors of the single gate structure.

Further, reduction in the channel length will be described. In a conventional thin film transistor of the multi-gate structure which is not provided with a lightly doped drain region, since the impurity doped into the source region and the drain region is diffused by a great amount in a horizontal direction, where a polycrystalline silicon film is used for an active region, if the channel length is set to 5 $\mu$m, then the effective channel length is 3 $\mu$m or less. Consequently, the concentration of an electric field at the end portion of the drain region becomes high, resulting in increase of the leak current. Accordingly, the conventional thin film transistor of the multi-gate structure is disadvantageous for enhancement in resolution and aperture ratio of a liquid crystal display device of the active matrix type. In contrast, with a lightly doped drain thin film transistor of the multi-gate structure of the present embodiment, since the concentration of an electric field at the end portion of the drain region can be alleviated by providing a lightly doped drain region there, the channel length can be set to 5 $\mu$m or less. In other words, enhancement of resolution and aperture ratio of a liquid crystal display device of the active matrix type can be achieved by the embodiment of the present invention.

Figure 9:
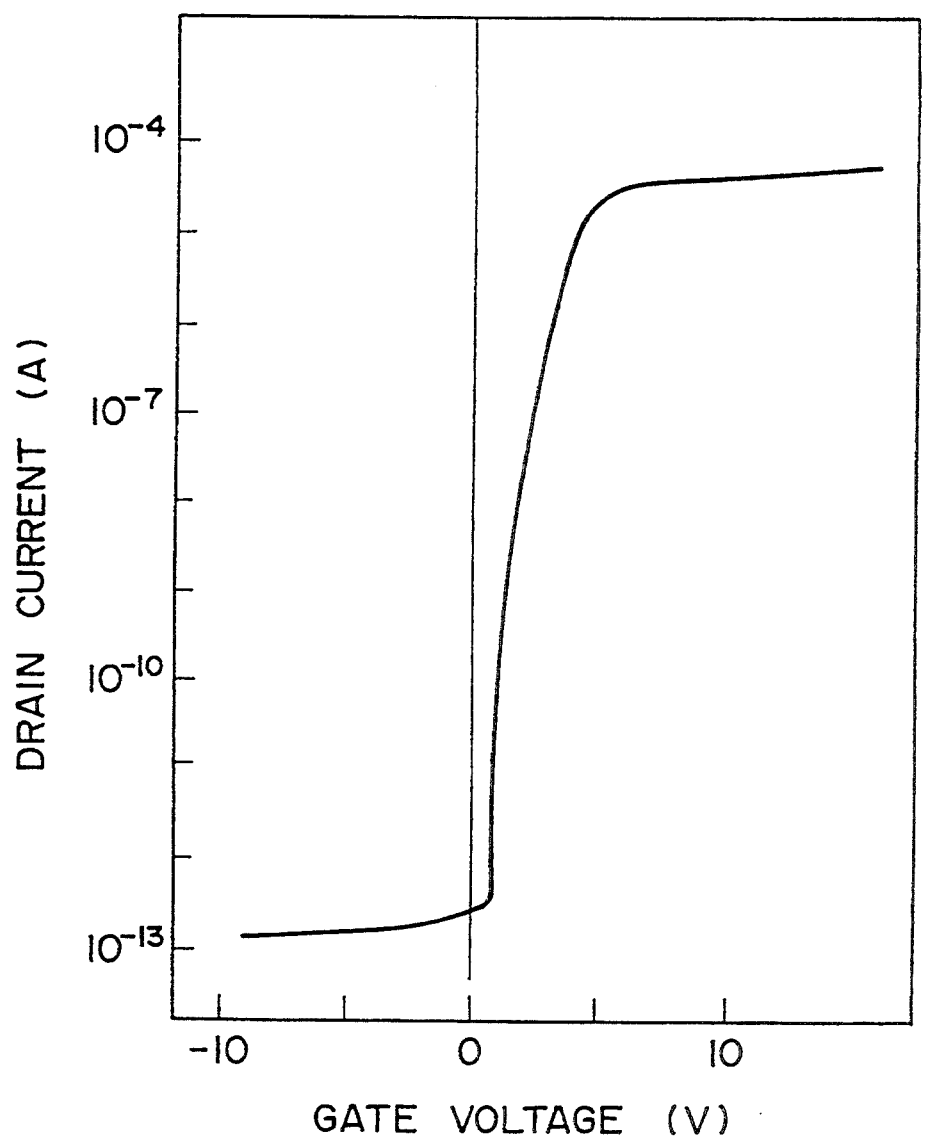
FIG. 9 is a graph showing a gate voltage-drain current curve of an n-channel multi-gate, lightly doped drain thin film transistor manufactured in accordance with to the present invention.
Figure 10:
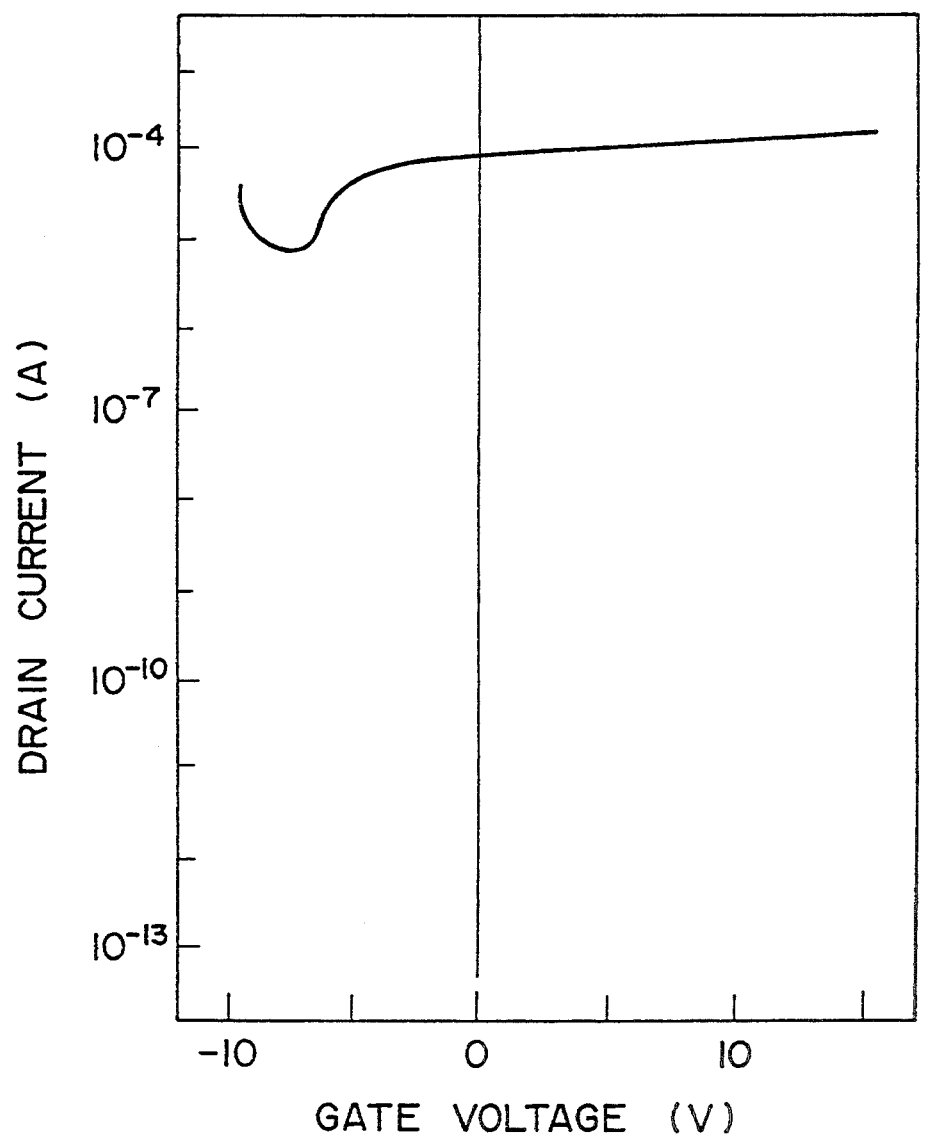
FIG. 10 is a graph showing a gate voltage-drain current curve of a conventional n-channel thin film transistor of the multi-gate type.

In order to indicate the advantages of the embodiment of the present invention described above more clearly, a gate voltage-drain current curve of the lightly doped drain thin field transistor of the multi-gate structure of the embodiment of the present invention is shown in FIG. 9. Meanwhile, a gate voltage-drain current curve of a conventional thin film transistor of the multi-gate structure is shown in FIG. 10 for comparison. It is to be noted that the total channel length of sample double-gate thin film transistor which was an object for measurement was 3 $\mu$m +3 $\mu$m and the channel width was 3 $\mu$m. Further, the source-drain voltage was set to 5 V, and the source-gate voltage was varied from $-10$ to $+15$ V. With the conventional thin film transistor of the multi-gate structure having no lightly doped drain region, the leak current exhibits a level rate and the characteristic exhibits a curve of the depression type, but with the lightly doped drain thin film transistor of the multi-gate structure of the embodiment of the present invention, no such high level of the leak current can be observed.

Subsequently, several modifications to the lightly doped drain thin film transistor of the multi-gate structure shown in FIG. 1 will be described. Generally, in a liquid crystal display device of the active matrix type, the liquid crystal layer is driven by ac in order to minimize degradation of the life. Consequently, the source side and the drain side are exchanged alternately, and accordingly, it is preferable to locate lightly doped drain regions symmetrically with respect to an end of the source and an end of the drain. In the arrangement shown in FIG. 1, two thin film transistors are connected in series. Naturally, three or more thin film transistors may be provided instead. Since the source side and the drain side are exchanged alternately because the liquid crystal is driven by ac, the lightly doped drain regions preferably have a symmetrical structural and positional relationship with respect to the source region and the drain region. In other words, preferably the source region and the drain region are equivalent to each other and can be exchanged for each other. Accordingly, in the embodiment of FIG. 1, the four lightly doped drain regions are provided adjacent the end faces of the gate electrodes 9. However, the arrangement of the lightly doped drain regions 6 is not limited to that of the embodiment shown in FIG. 1. When the thin film transistor is provided for a switching element for a picture element, it is required that only the symmetry between the source and the drain be maintained. Accordingly, for example, lightly doped drain regions 6 may be provided at only two locations including an end portion of the source region 3 and an end portion of the drain region 5 as shown in FIG. 2. Or else, lightly doped drain regions 6 may be provided only at two locations on the opposite ends of the source/drain region 4 between the source region 3 and the drain region 5 as shown in FIG. 3. It is to be noted that, in order to facilitate understanding, common elements to those of the embodiment shown in FIG. 1 are denoted by same reference numerals in FIGS. 2 and 3.

Figure 4:
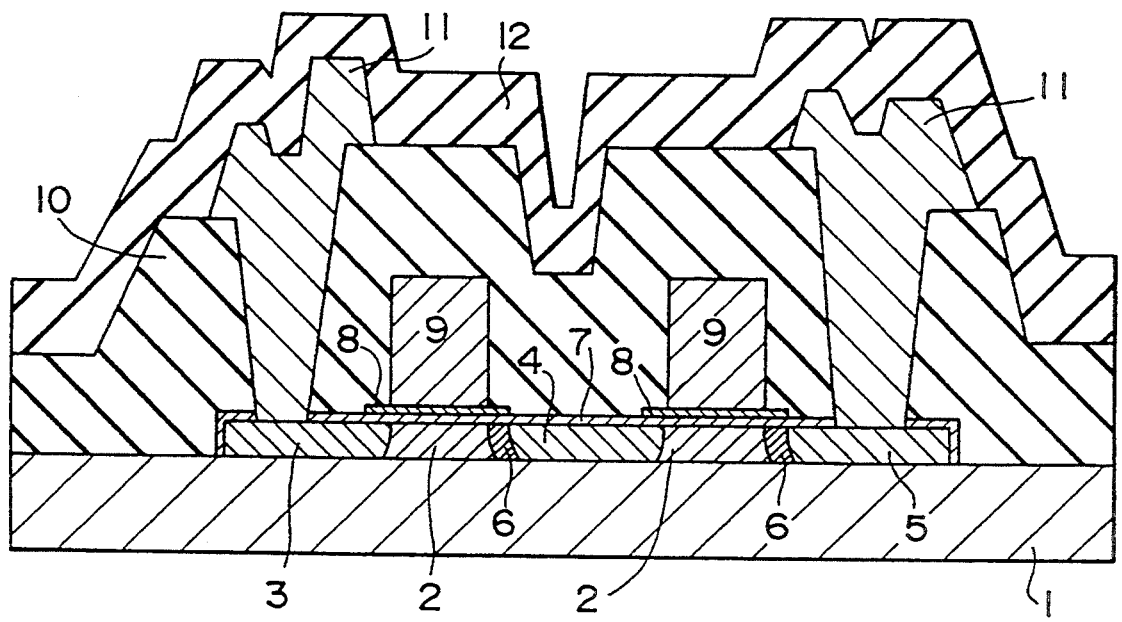
FIG. 4 is a similar view but showing a further modification to the thin film transistor of FIG. 1.
Figure 5:
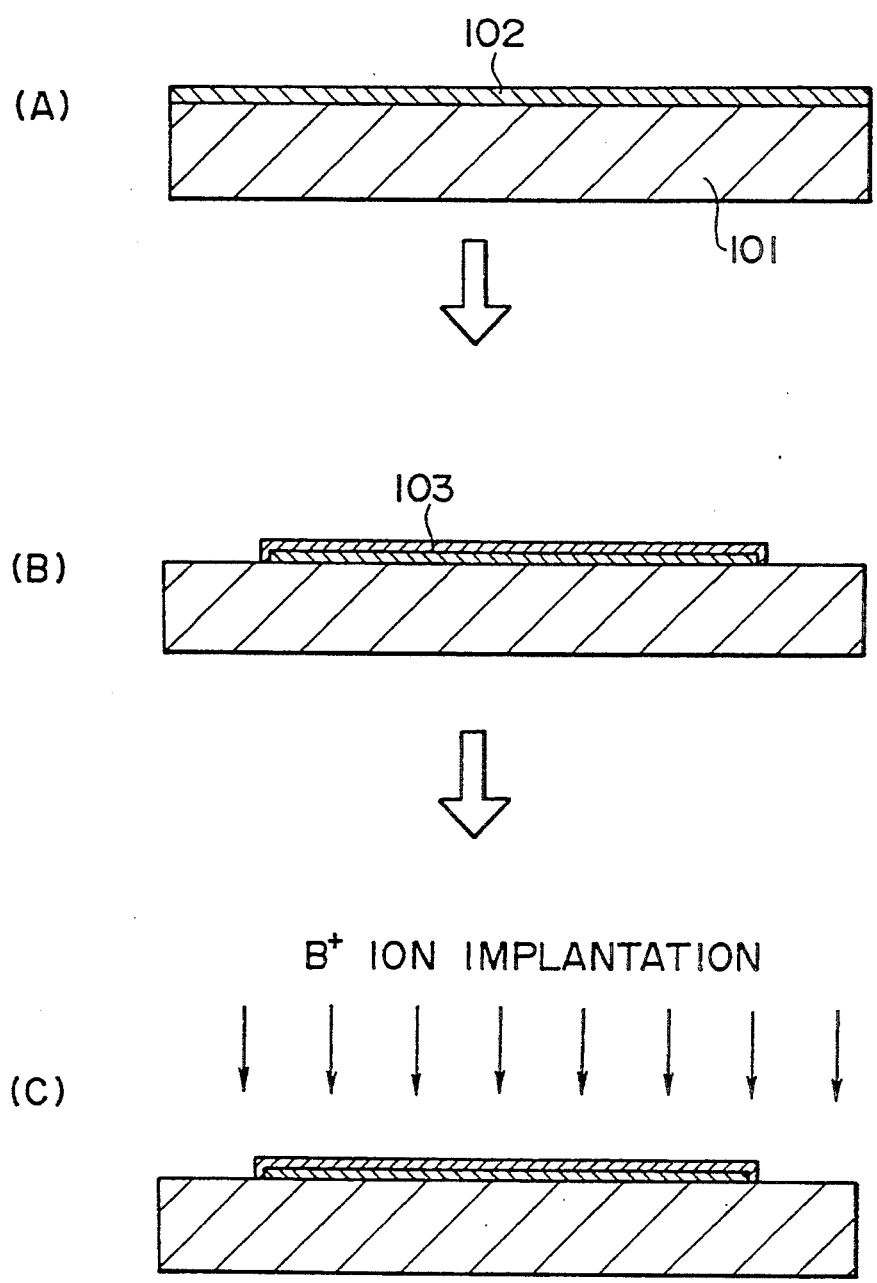
FIGS. 5(A) to 5(C), 6(D) to 6(G), 7(H) to 7(J) and 8(K) to 8(M) are schematic sectional views illustrating successive steps of a process of manufacturing the thin film transistor of FIG. 1.
Figure 6:
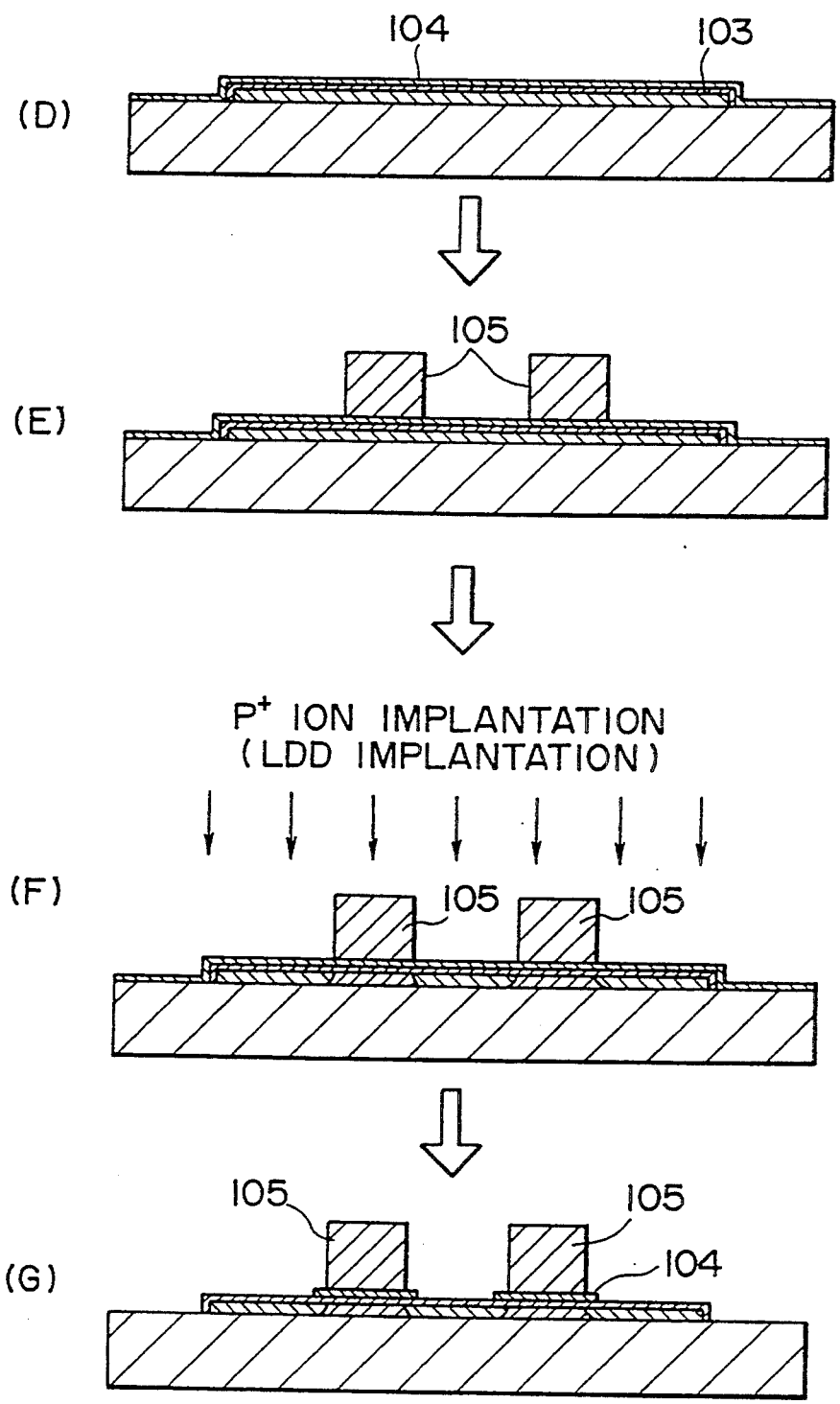
Figure 7:
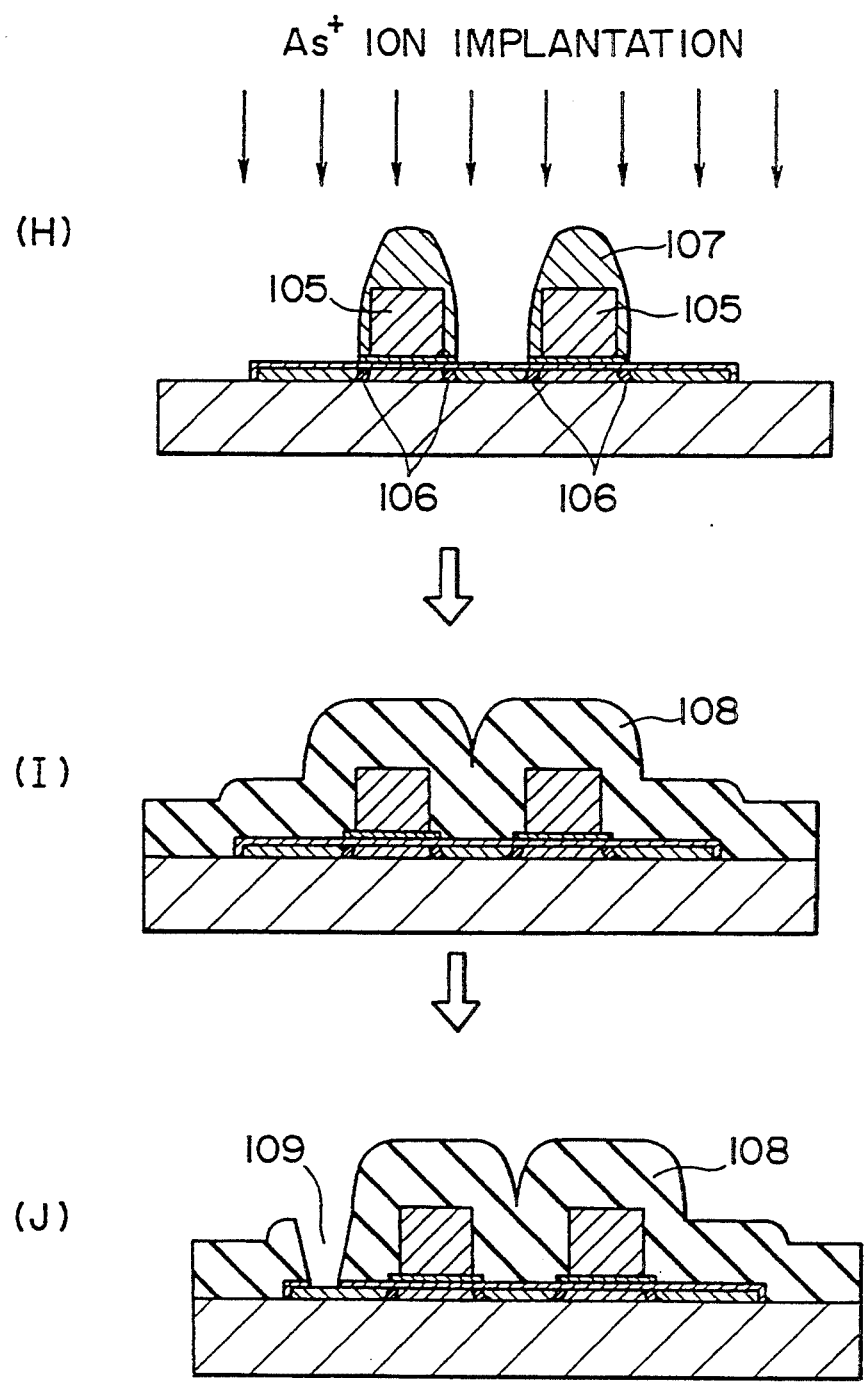
Figure 8:
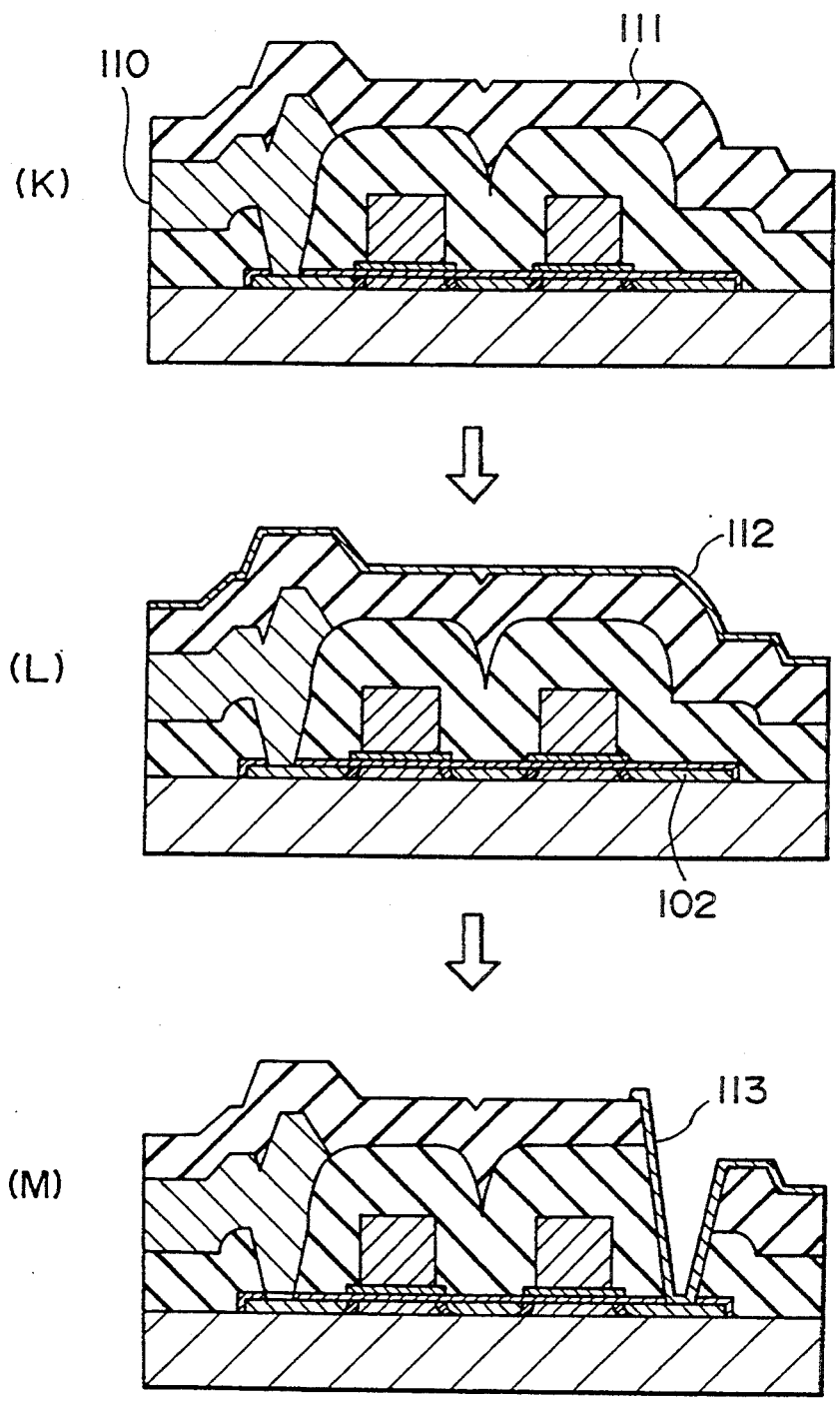

A lightly doped drain thin film transistor of the multi-gate structure according to the present invention can be employed not only for a switching element for a picture element but also in various peripheral circuits formed on a same substrate such as, for example, a horizontal driver circuit or a vertical driver circuit. An example of such application is shown in FIG. 4. It is to be noted that, in order to facilitate understanding, elements corresponding to those of the structure shown in FIG. 1 are denoted by corresponding reference numerals. Generally, when thin film transistors are incorporated in a peripheral circuit, the directions of the drains are determined in advance, different from switching elements. Therefore, as shown in FIG. 4, lightly doped drain regions 6 are provided only at an end portion of the drain region 5 and an end portion of the source/drain region 4 adjacent the source region 3 while no lightly doped drain region is formed at an end portion of the source region 3 or an end portion of the source/drain region 4 adjacent the drain region 5. By omitting some of the lightly doped drain regions in this manner, the on-current of the thin film transistor is increased and the driving capacity of the thin film transistor is enhanced.

Subsequently, a process of manufacturing a lightly doped drain thin film transistor of the multi-gate structure according to the present embodiment will be described in detail with reference to FIGS. 5(A) to 8(M). First at a step A illustrated in FIG. 5(A), a polycrystalline silicon thin film 102 is formed with the thickness of about 75 nm on a quartz substrate 101 by the LPCVD method. If necessary, Si+ ions are implanted into the polycrystalline silicon thin film 102 to change it into an amorphous state, and then the polycrystalline silicon thin film 102 is annealed at the temperature of approximately 600° C. in a furnace to change the polycrystalline silicon into particles of large sizes. It is to be noted that, where amorphous silicon is formed in advance, it may be formed into a film at the temperature of approximately 150° to 250° C. using the plasma chemical vapor deposition (PCVD) method. Subsequently at another step B illustrated in FIG. 5(B), the polycrystalline silicon thin film 102 is etched into an island-like pattern. Then, the polycrystalline silicon thin film 102 is oxidized to form a gate oxide film 103 with the thickness of about 60 nm on the surface thereof. Thereafter, at a next step C illustrated in FIG. 5(C), B+ ions for adjustment of the threshold voltage for a thin film transistor are implanted.

Then at a step D illustrated in FIG. 6(D), a nitride silicon film ($Si_3N_4$ film) 104 is formed with the thickness of about 10 to 20 nm on the gate oxide film 103 by the LPCVD method. In some cases, the surface of the nitride silicon film 104 may be oxidized to form a $SiO_2$ film with the thickness of about 1 to 2 nm. A composite gate insulator film is obtained in this manner and has a three-layer structure called ONO structure including layers of $SiO_2$, $Si_3N_4$ and $SiO_2$. Such a structure is adopted in order to sufficiently assure a high gate voltage bearing property to enhance the reliability. Subsequently at a step E illustrated in FIG. 6(E), a phosphor-doped low-resistance polycrystalline silicon film is formed with the film thickness of about 350 nm on the gate insulator film and then patterned into a predetermined pattern to form a pair of gate electrodes 105. The gate electrodes 105 may be formed by any of the following three methods. The first method involves formation of a non-doped polycrystalline silicon thin film and diffusion of phosphor from $PClO_3$ gas into the polycrystalline silicon thin film. The second method involves diffusion of phosphor using a PSG film in place of $PClO_3$ gas in the first method. The third method involves heat dissolution of a mixture gas of $SiH_4$ gas and $PH_3$ gas to form a doped polycrystalline silicon film by the LPCVD method. While any one of the methods may be employed, the first method was employed to manufacture the thin film transistor structure of the first embodiment described above. It is to be noted that, in the present embodiment, the gate electrodes were patterned to set the channel length L of each thin film transistor to 3 $\mu$m and the channel width W to 3 $\mu$m. Subsequently, lightly doped drain regions are formed at a step F illustrated in FIG. 6(F). In order to form lightly doped drain regions, when the thin film transistor to be formed is an n-channel thin film transistor, after the gate electrodes 105 are formed, As+ or P+ ions are implanted at a dose rate of 0.5 to $1.5 \times 10^{13}/cm^2$. On the other hand, when the thin film transistor to be formed is a p-channel thin film transistor, B+ ions should be implanted at a dose rate of 0.1 to $2.0 \times 10^{13}/dm^2$ similarly in place of As+ or P+ ions. Subsequently at a step G illustrated in FIG. 6(G), the $Si_3N_4$ film 104 is cut along the peripheries of the gate electrodes 105 into predetermined shapes.

Then at a step H illustrated in FIG. 7(H), a resist film 107 is formed so that the ranges of 1 $\mu$m from the opposite sides of the gate electrodes 105 may be left as lightly doped drain regions 106. Subsequently, ions of an impurity are implanted at a dose rate of 1 to $3 \times 10^{15}/cm^2$ to form a source region and a drain region. In this instance, when the thin film transistor to be formed is an n-channel thin film transistor, As+ or P+ ions are implanted, but when the thin film transistor to be formed is a p-channel thin film transistor, B+ ions are implanted. While the lengthwise dimension of the lightly doped drain regions 106 is not limited to 1 $\mu$m, it should be 0.5 $\mu$m or more with thin film transistors for switching elements for picture elements for which reduction of the leak current is required severely. Thereafter, at a step I illustrated in FIG. 7(I), a first interlayer insulator film 108 made of a PSG is formed with the thickness of about 600 nm by the LPCVD method, and then nitrogen atmosphere annealing is formed for 10 minutes at 1,000° C. to activate the source region, the drain region and the lightly doped drain regions. Then at a step J illustrated in FIG. 7(J), a contact hole 109 is formed at a predetermined location of the first interlayer insulator film 108.

Then at a step K illustrated in FIG. 8(K), metal aluminum to make a wiring electrode 110 is deposited with the thickness of about 600 nm and patterned. A second interlayer insulator film 111 made of a PSG is formed with the thickness of about 400 nm on the first interlayer insulator film 108. Subsequently at a step L illustrated in FIG. 8(L), a nitride silicon film (P-SiNx film) 112 is formed with the thickness of about 100 nm by the PCVD method. Since the P-SiNx film 112 contains a large amount of water, hydrogen can be diffused into the thin film transistor effectively by performing annealing after formation of the P-SiNx film 112. By such a hydrogen diffusion, the defect density of the polycrystalline silicon film 102 can be reduced to suppress the leak current of the thin film transistor arising from a defect. Finally at a step M illustrated in FIG. 8(M), the P-SiNx film 112 is removed entirely by etching to open the contact hole, and then a transparent conductor film of an ITO or a like material is formed with the thickness of about 150 nm. Then, the ITO film is patterned into a predetermined shape to obtain a picture element electrode 113.

It is to be noted that, while, in the thin film transistor structure obtained in accordance with the first embodiment of the present invention, the channel length of each thin film transistor was set to 3 μm; the channel width was set to 3 μm; and the length of the lightly doped drain regions was set to 1 μm, the dimensions of the thin film transistors are not limited to those specific values. Further, while, in the embodiment described above, the gate electrode of the thin film transistor is made of polycrystalline silicon and the gate insulator film has a multi-layer structure while metal aluminum is used for the wiring electrode, the present invention is not limited to the specific construction. For example, the gate electrode may be made of such a metal as a silicide, polycide, Ta, Al, Cr, Mo or Ni or an alloy of those metals. In addition, the present invention can be applied to thin film transistors of any of the planar type, the regular staggered type and the reverse staggered type.

Figure 11:
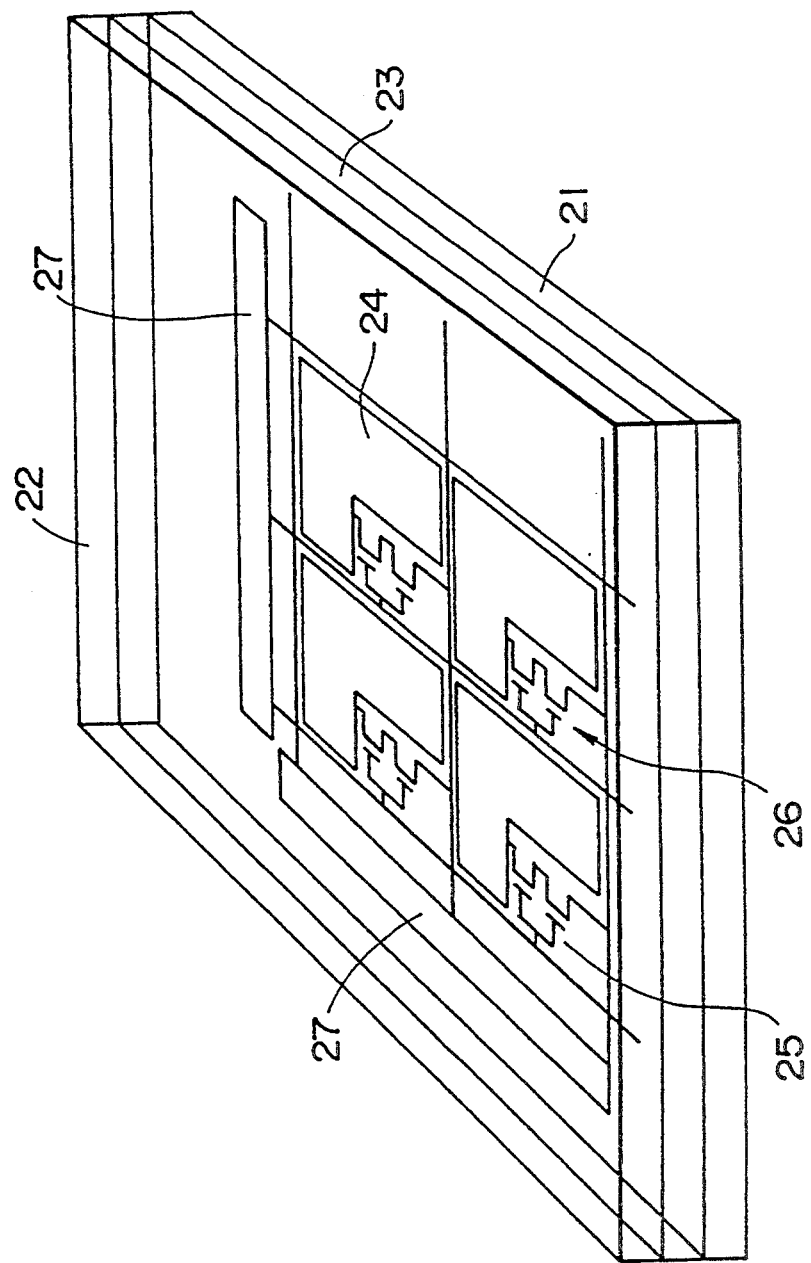
FIG. 11 is a schematic perspective view showing an example of a liquid crystal display device of the active matrix type constructed using lightly doped drain thin film transistors having a multi-gate structure according to the present invention.
Figure 12:
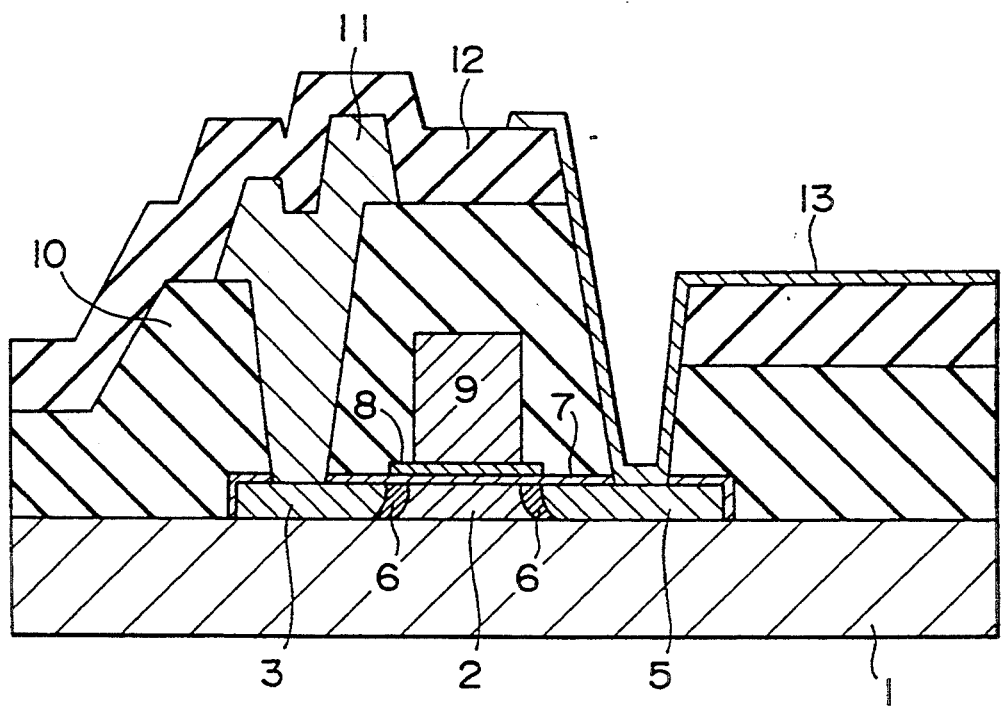
FIG. 12 is a sectional view showing a conventional thin film transistor of the lightly doped drain structure.
Figure 13:
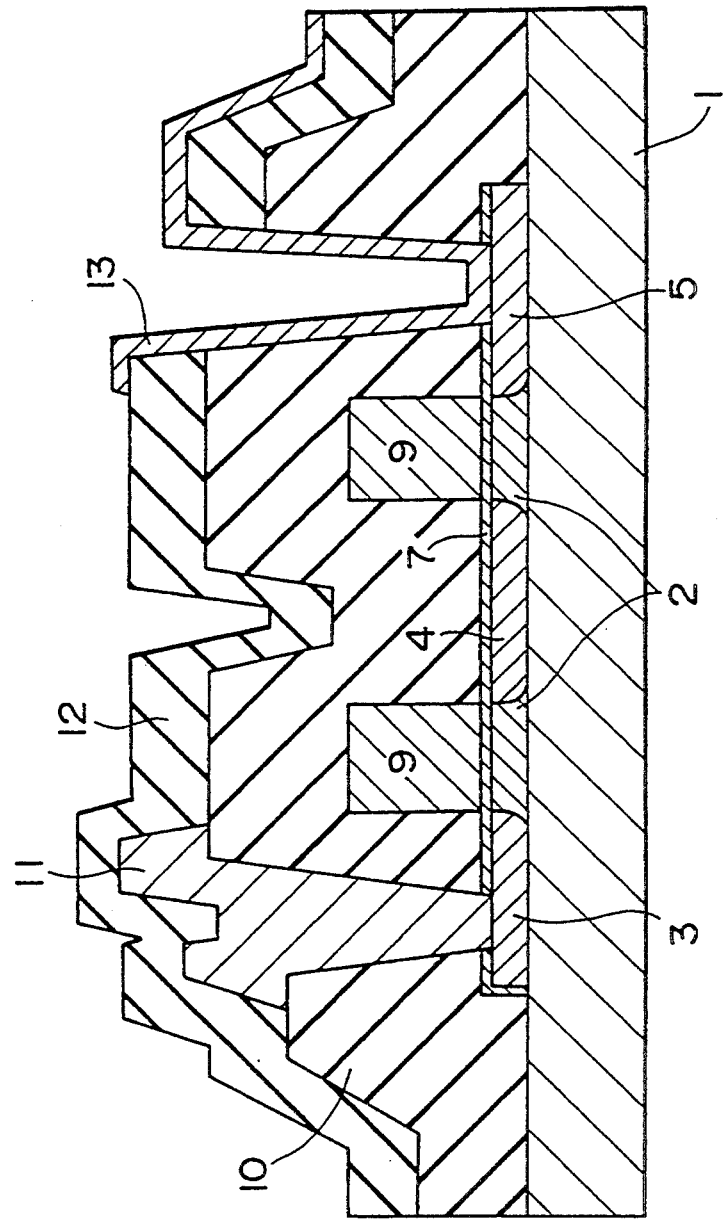
FIG. 13 is a sectional view showing a conventional thin film transistor of the multi-gate structure.
Figure 14:
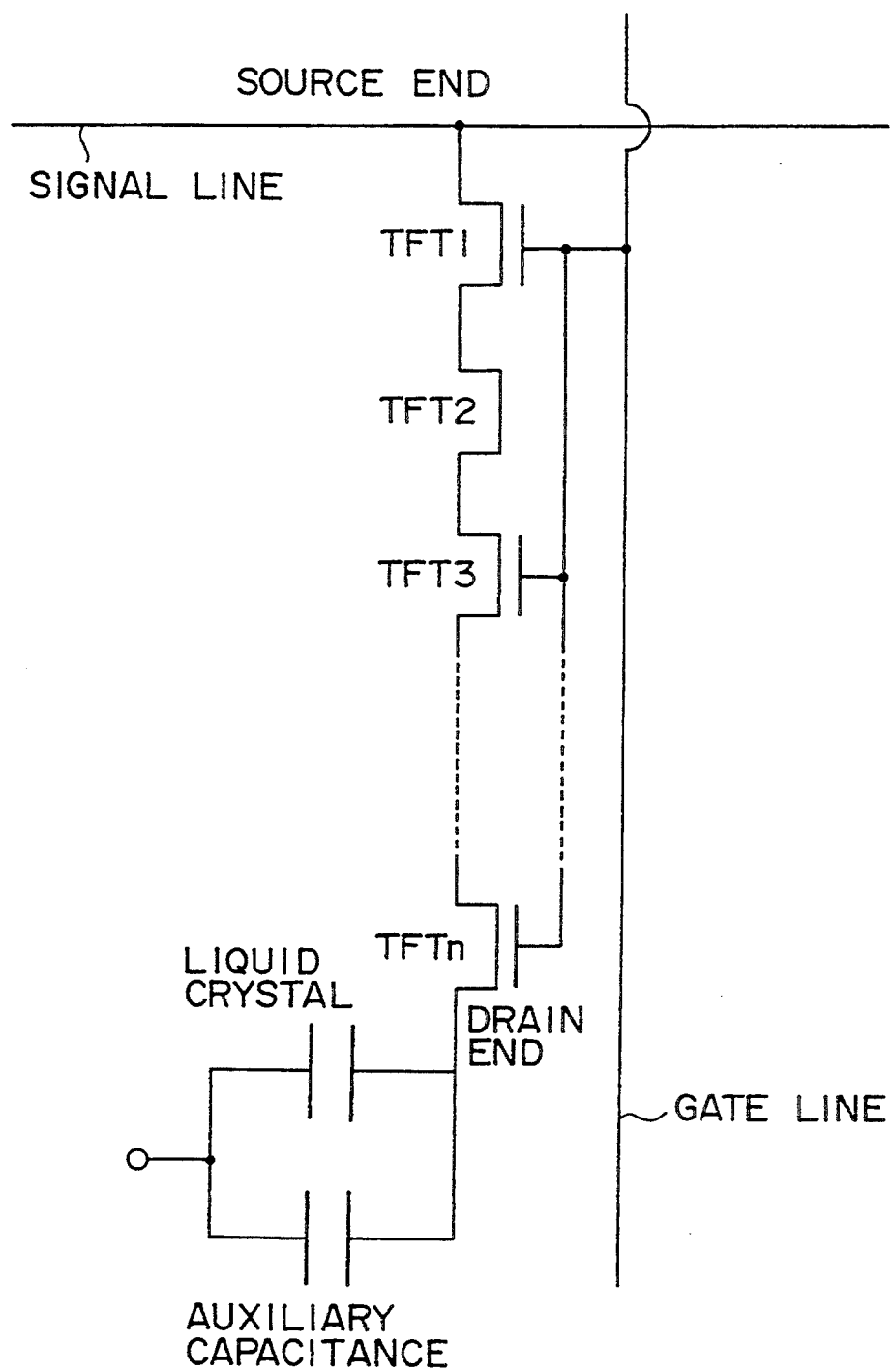
FIG. 14 is a circuit diagram of an equivalent circuit for one picture element of a liquid crystal display device of the active matrix type which employs the conventional thin film transistor of the multi-gate structure of FIG. 13 as a switching element.

Subsequently, an example of a liquid crystal display device of the active matrix type constructed using such lightly doped drain thin film transistors of the multi-gate structure of the embodiment described above will be described with reference to FIG. 11. The liquid crystal display device has a structure of an active matrix substrate 21 and an opposing substrate 22 adhered to each other with a spacer 23 interposed between them. A liquid crystal layer is filled between the substrates 21 and 22. A liquid crystal display section 26 and peripheral driver circuit sections 27 connected to the liquid crystal display section 26 are formed on the surface of the active matrix substrate 21. The liquid crystal display section 26 includes picture element electrodes 24 arranged in a matrix and switching elements 25 for driving the picture electrodes 24. The switching elements 25 are constituted from lightly doped drain thin film transistors of the multi-gate structure. Or in some cases, the thin film transistors constituting the peripheral driver circuits 27 may have such a structure. Meanwhile, opposing electrodes are formed on the inner surface of the opposing substrate 22.

Figure 15:
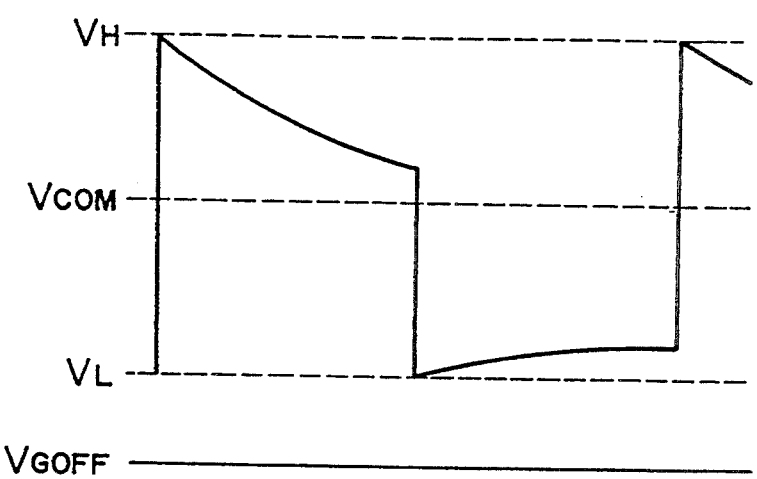
FIG. 15 is a waveform diagram illustrating a variation of the picture element potential of a conventional liquid crystal display device of the active matrix type.

Subsequently, another liquid crystal display device of the active matrix type according to a second preferred embodiment of the present invention will be described. The liquid crystal display device of the present embodiment is improved particularly in the structure for suppressing the leak current of thin film transistors thereof which arises from ac driving. Before the description of the liquid crystal display device of the second embodiment is entered, and in order to facilitate understanding of the background, a current leaking phenomenon of a thin film transistor which relies upon the polarity upon ac driving will be described briefly with reference to FIG. 15. Generally in a liquid crystal display device of the active matrix type, the potential at the picture element electrode relative to the potential VCOM at the opposing electrode repeats a cycle of charging and holding of the positive polarity and charging and holding of the negative polarity, and each of the picture element electrode side and the input signal line side of each thin film transistor alternately serves as the source and the drain. It has been found out that the leak current between the source and the drain is different whether the positive polarity or the negative polarity is held. As regards the potential difference between the picture element electrode and the gate electrode of the thin film transistor, since, during holding of the positive polarity, a high signal voltage $V_H$ is written into the picture element electrode, a large potential difference is produced from the gate voltage $V_{GOFF}$ in an off state through the holding time. On the other hand, during holding of the negative polarity, since a voltage $V_L$ of the reverse polarity, which is near to the gate voltage $V_{GOFF}$ in an off state, is written into the picture element electrode, the potential difference from the gate electrode is small. In other words, a high electric field is continuously applied between the gate electrode and the picture element electrode during holding of the positive polarity. Further, even when the thin film transistor is symmetrical in structure between the picture element electrode side and the signal line side, the picture element electrode side of the thin film transistor is more liable to be damaged than the signal line side from a reason arising from the process of manufacture. Therefore, the leak current flowing through the defect level in the polycrystalline silicon film is much higher during holding of the positive polarity than during holding of the negative polarity, and consequently, the picture element potential written cannot be held sufficiently, resulting in appearance as a brightness point defect. When, as a countermeasure to this, a thin film transistor is formed asymmetrically in structure in order to suppress the leak current of the picture element electrode side, there is a problem in that, since the degree of freedom in designing a picture element switching thin film transistor decreases, it cannot be avoided to sacrifice the open area rate of the liquid crystal picture element or that the on-current of the thin film transistor cannot be assured sufficiently, resulting in insufficient writing of the picture element potential. Accordingly, the second embodiment described below solves the problem just mentioned and achieves high on-current and low leak current simultaneously without sacrificing the degree of freedom in designing a thin film transistor.

Figure 16:
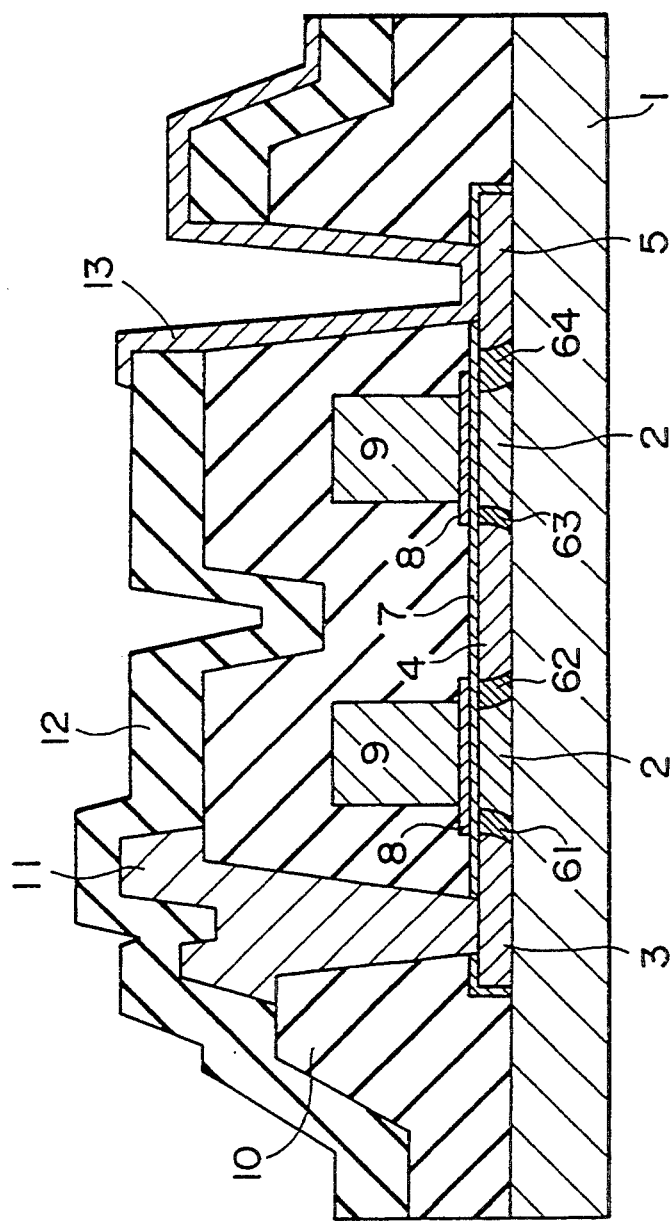
FIG. 16 is a partial sectional view of a thin film transistor of a liquid crystal display device of the active matrix type showing a second preferred embodiment of the resent invention.

FIG. 16 shows the liquid crystal display device of the active matrix type of such a second embodiment and is a partial sectional view showing a thin film transistor and associated elements in an enlarged scale. The thin film transistor shown is an n-channel thin film transistor and constitutes a switching element for driving a picture element of the liquid crystal display device of the active matrix type. A polycrystalline silicon film is formed in a pattern on a quartz substrate 1. The polycrystalline silicon film has formed therein a source region 3, a source/drain region 4, a drain region 5, and a pair of channel regions 2 which are located between the source region 3 and the source/drain region 4 and between the source/drain region 4 and the drain region 5. A total of four low density impurity regions or lightly doped drain regions 61 to 64 of the same conductivity type as that of the source region 3 and the drain region 5 are formed between the source region 3 and source/drain region 4 and one of the channel regions 2 located between the source region 3 and the source/drain region 4 and between the source/drain region 4 and drain region 5 and the other channel region 2 located between the source/drain region 4 and the drain region 5. A gate electrode 9 is formed above each of the channel regions 2 with a gate insulator film interposed therebetween. The gate insulator films have a two-layer structure including a gate oxide film 7 and a gate nitride film 8. The quartz substrate 1 is covered with a first interlayer insulator film 10 made of a PSG or a like material. A wiring electrode 11 made of aluminum or a like material is electrically connected to the source region 3 through a contact hole formed in the first interlayer insulator film 10. A picture element electrode 13 made of an ITO or a like material is electrically connected to the drain region 5 through another contact hole formed similarly in the first interlayer insulator film 10. The picture element electrode 13 is formed on the second interlayer insulator film 12.

The liquid crystal display device of the present embodiment is characterized in that at least one of a plurality of lightly doped drain regions formed on a plurality of thin film transistors has a length different from that of the other lightly doped drain regions. In particular, the length of the first and second lightly doped drain regions 61 and 62 is set to 1 $\mu$m; the length of the third lightly doped drain region 63 is set to 0.5 $\mu$m; and the length of the fourth lightly doped drain region 64 is set to 1.5 $\mu$m. The reason why the length of the fourth lightly doped drain region 64 is set to 1.5 $\mu$m is that it is intended to suppress the leak current on the picture element electrode side. The reason why the length of the third lightly doped drain region 63 is set to 0.5 $\mu$m is that it is intended to compensate for a drop of the on-current, which arises from the fact that the fourth lightly doped drain region 64 is set longer than the other lightly doped drain regions, to assure sufficiently high writing current. Even if the length of the third lightly doped drain region 63 is decreased to 0.5 $\mu$m, there is no possibility that the leak current may increase. It has been made clear by an analysis that, when the picture element electrode side holds a potential of the positive polarity, the highest electric field is applied to the fourth lightly doped drain region 64 as described hereinabove.

Figure 17:
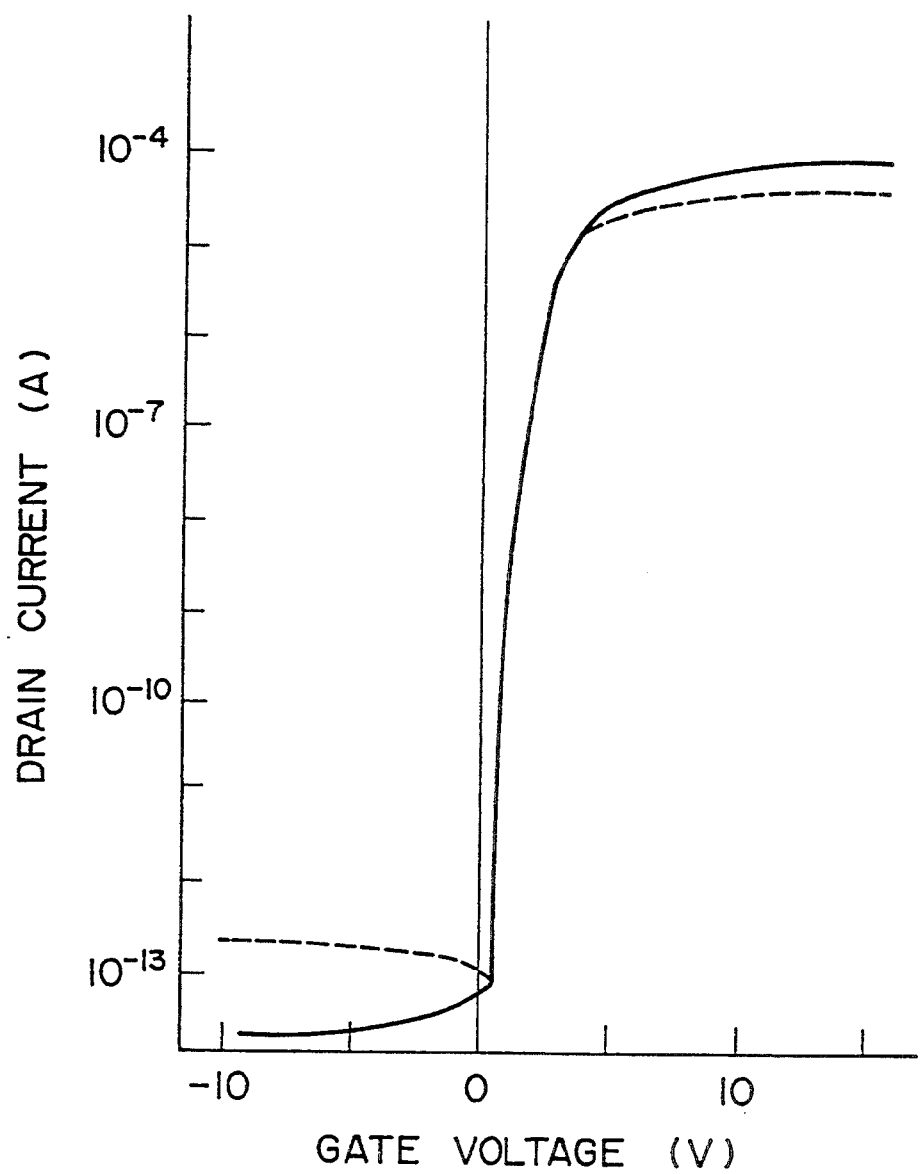
FIG. 17 is a graph showing a gate voltage-drain current curve of the n-channel multi-gate, lightly doped drain thin film transistor shown in FIG. 16.

FIG. 17 is a graph showing a gate voltage-drain current curve of an n-channel thin film transistor of the lightly doped drain type manufactured in accordance with the second embodiment described above. In particular, a solid line indicates a characteristic curve of the thin film transistor in the second embodiment while a broken line indicates a characteristic curve of a conventional thin film transistor. The conventional thin film transistor is a single gate thin film transistor of the lightly doped drain type wherein the channel length L is 5 $\mu$m; the channel width W is 3 $\mu$m; the lightly doped drain length is 1 $\mu$m; and the lightly doped drain density is $1 \times 10^{13}$ cm$^{-2}$. A measurement was conducted with the picture element electrode caused to operate as the drain with both of the thin film transistors. The drain voltage was 10 V. As apparently seen from FIG. 17, the thin film transistor in the second embodiment has a very superior characteristic in that the leak current thereof is lower by one column and the on-current is higher by twice or more than the conventional thin film transistor.

Figure 18:
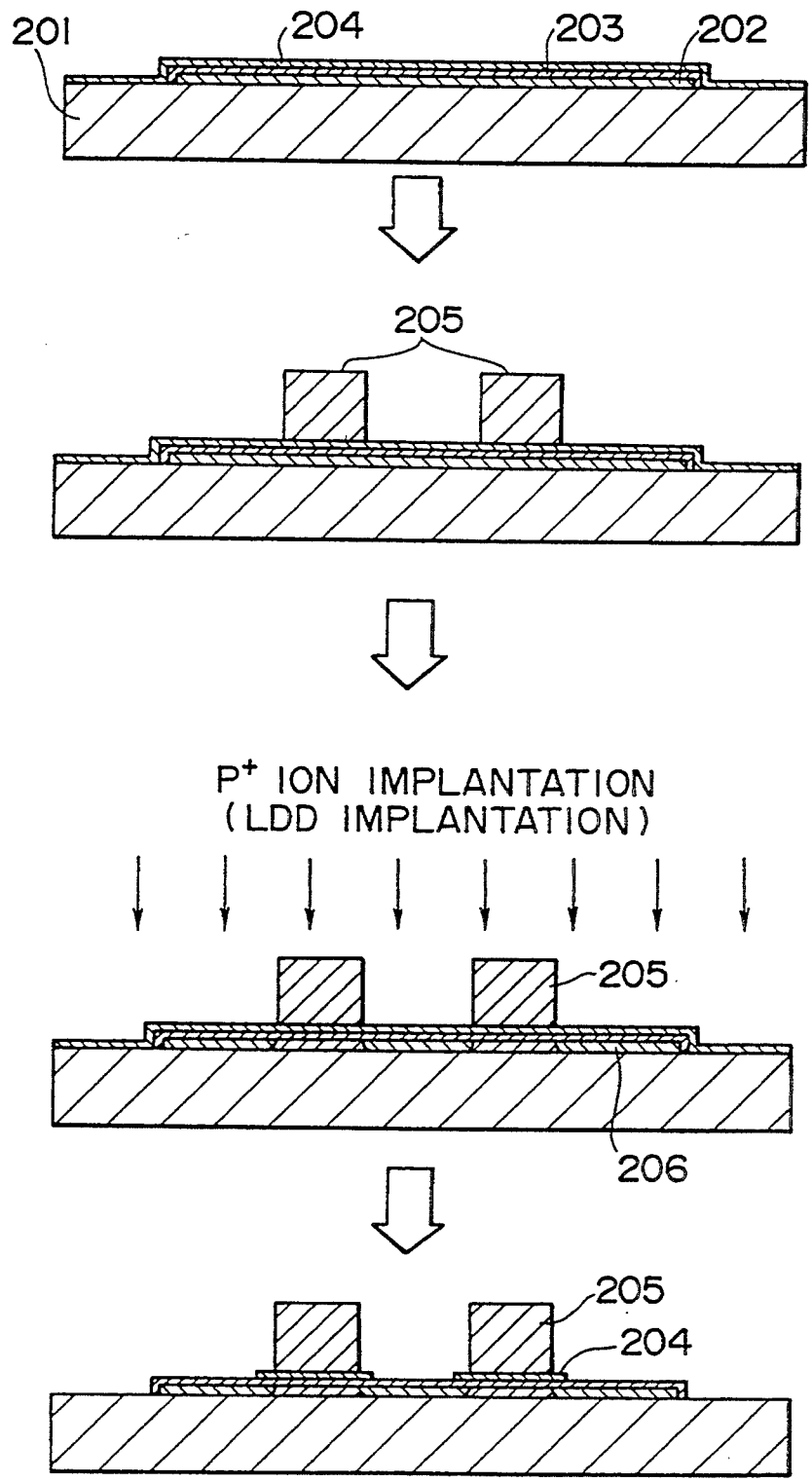
FIGS. 18 to 20 are schematic sectional views showing successive steps of a process of manufacturing the thin film transistor of FIG. 17.

Subsequently, a process of manufacturing the thin film transistor in the second embodiment described above will be described with reference to FIGS. 18 to 20. Referring first to FIG. 18, a polycrystalline silicon thin film 202 is formed with the thickness of about 75 nm on a quartz substrate 201 by the LPCVD method. If necessary, Si+ ions are implanted into the polycrystalline silicon thin film 202 to change it into an amorphous state, and then the polycrystalline silicon thin film 202 is annealed at the temperature of approximately 600° C. in a furnace to change the polycrystalline silicon into particles of large sizes. It is to be noted that, where amorphous silicon is formed from the beginning, it may be formed into a film at the temperature of approximately 150° to 250° C. using the PCVD method. Subsequently, the polycrystalline silicon thin film 202 is etched into a pattern in accordance with a thin film transistor to be formed. Then, the polycrystalline silicon thin film 202 is oxidized to form a gate oxide film 203 with the thickness of about 60 nm. Thereafter, a Si$_3$N$_4$ film 204 is formed with the thickness of about 10 to 20 nm on the gate oxide film 203 by the LPCVD method. In some cases, the surface of the Si$_3$N$_4$ film 204 may be oxidized to form a SiO$_2$ film with the thickness of about 1 to 2 nm. A gate insulator film is obtained in this manner and has a three-layer structure called ONO structure including layers of SiO$_2$, Si$_3$N$_4$ and SiO$_2$. The structure is adopted in order to sufficiently assure a high gate voltage bearing property to enhance the reliability. Subsequently, in order to control the threshold voltage Vth of the thin film transistor, B+ ions are implanted at a dose rate of about 1 to $8 \times 10^{18}$ cm$^{-2}$ if necessary. Then, a phosphor-doped low-resistance polycrystalline silicon film is formed with the film thickness of about 350 nm on the gate insulator film to form a gate electrode 205. The gate electrode 205 may be formed by any of the following three methods. The first method involves formation of a non-doped polycrystalline silicon thin film and diffusion of phosphor from PClO$_3$ gas into the polycrystalline silicon thin film. The second method involves diffusion of phosphor using a PSG film in place of PClO$_3$ gas in the first method. The third method involves heat dissolution of a mixture gas of SiH$_4$ gas and PH$_3$ gas to form a doped polycrystalline silicon film by the LPCVD method. While any one of the methods may be employed, the first method was employed to manufacture the thin film transistor structure of the second embodiment described above. It is to be noted that, in the present embodiment, the channel length L of the double-gate thin film transistor was set to 3 $\mu$m and the channel width W was set to to 3 $\mu$m. Subsequently, lightly doped drain regions 206 are formed. In order to form lightly doped drain regions, when the thin film transistor to be formed is an n-channel thin film transistor, after the gate electrode 205 is formed, As+ or P+ ions are implanted at a dose rate of 0.5 to $1.5 \times 20^{13}/cm^2$. On the other hand, when the thin film transistor to be formed is a p-channel thin film transistor, B+ ions should be implanted at a dose rate of 0.1 to $2.0 \times 20^{13}/dm^2$ similarly in place of As+ or P+ ions. Subsequently, the $Si_3N_4$ film 204 is cut along the peripheries of the gate electrodes 205 into predetermined shapes.

Figure 19:
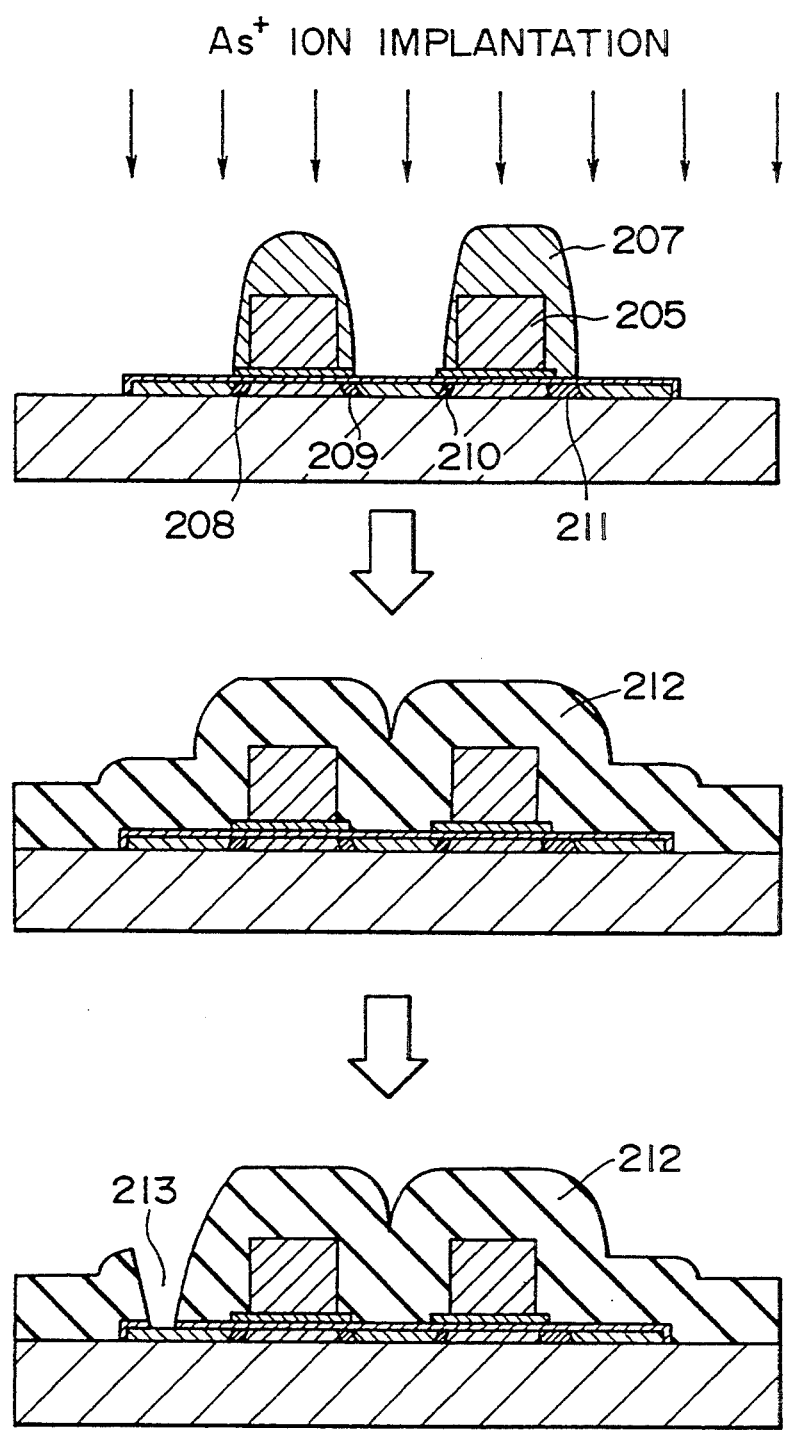

Referring now to FIG. 19, a resist film 207 is formed so that the ranges of a predetermined length from the opposite sides of the gate electrode 205 may be left. Subsequently, As+ or P+ ions are implanted at a dose rate of 1 to $3 \times 20^{15}/cm^2$ to form a source region and a drain region in order to form an n-channel thin film transistor. It is to be noted that, when a p-channel thin film transistor is to be formed, B+ ions are implanted. The shape of a pattern for the resist film 207 is suitably set so as to leave lightly doped drain regions having a desired lengthwise dimension. As described hereinabove, the length of the first and second lightly doped drain regions 208 and 209 is 1 μm; the length of the third lightly doped drain region 210 is 0.5 μm; and the length of the fourth lightly doped drain region 211 is 1.5 μm. Thereafter, a first PSG film 212 is formed with the thickness of about 600 nm by the LPCVD method, and then $N_2$ annealing is performed for 10 minutes at 1,000° C. to activate the source region, the drain region and the lightly doped drain regions. Then, a contact hole 213 is formed in the first PSG film 212.

Figure 20:
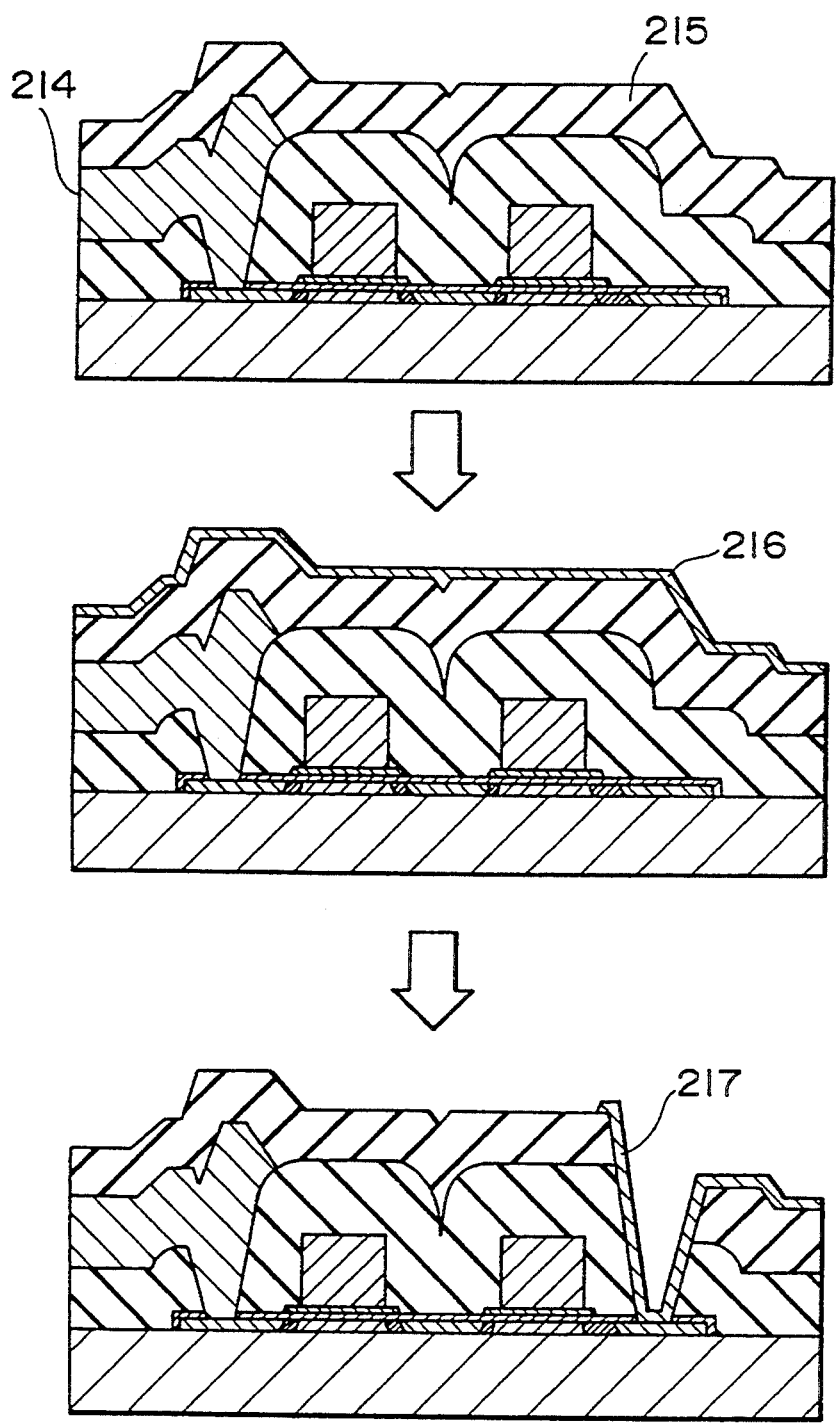

Referring now to FIG. 20, aluminum to make a wiring electrode 214 is formed with the thickness of about 600 nm and patterned. A second PSG film 215 is formed with the thickness of about 400 nm on the aluminum film. Subsequently, a nitride silicon film (P-SiNx film) 216 is formed with the thickness of about 100 nm by the PCVD method. Since the P-SiNx film 216 contains a large amount of water, hydrogen can be diffused into the thin film transistor effectively by performing annealing after formation of the P-SiNx film 216. By such hydrogen diffusion, the defect density of the polycrystalline silicon film 202 can be reduced to suppress the leak current of the thin film transistor arising from a defect. Finally, the P-SiNx film 216 is removed by etching to open the contact hole, and then an ITO thin film is formed with the thickness of about 150 nm. Then, the ITO film is patterned into a predetermined shape to form a picture element electrode 217.

Figure 21:
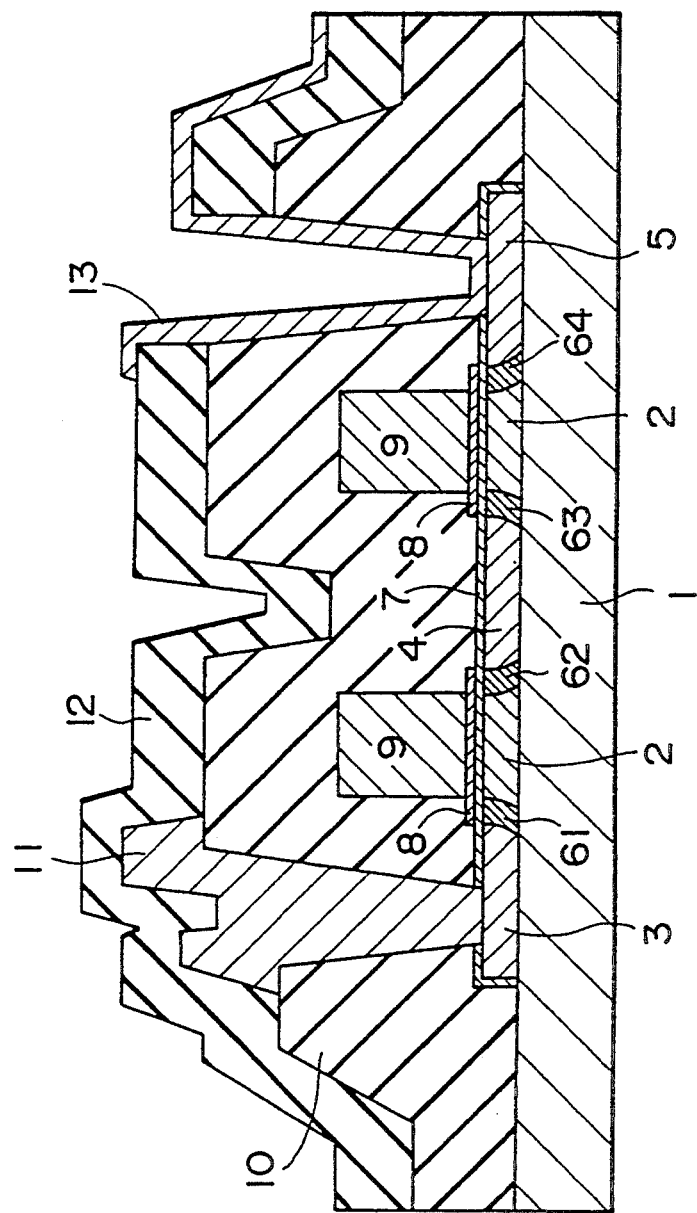
FIG. 21 is a schematic sectional view of a liquid crystal display device of the active matrix type showing a third preferred embodiment of the present invention.

FIG. 21 is a schematic sectional view of a further liquid crystal display device of the active matrix type showing a third preferred embodiment of the present invention. The liquid crystal display device of the present embodiment basically has a same structure as the liquid crystal display device of the second embodiment described above, and corresponding elements are denoted by common reference numerals. The liquid crystal display device of the present embodiment is different from the liquid crystal display device of the second embodiment in that at least one of the first to fourth lightly doped drain regions 61, 62, 63 and 64 has a different density than the other lightly doped drain regions. In contrast, all of the lightly doped drain regions 61 to 64 are set to the same length of 1.0 μm. In particular, the fourth lightly doped drain region 64 which is located nearest to the picture element electrode 13 has a lower density than the other lightly doped drain regions 61, 62 and 63. For example, after formation of the gate electrode 9, As+ p+ or ions are implanted approximately at a dose ratio of 0.1 to $0.4 \times 10^{13} cm^{-2}$, and then only the fourth lightly doped drain region 64 is covered with resist, whereafter As+ or P+ ions are implanted again at a dose ratio of 0.6 to $1.2 \times 10^{13} cm^{-2}$. Since a thin film transistor wherein only the density is low only in the fourth lightly doped drain region 64 is produced in this manner, the leak current can be suppressed low. With the liquid crystal display device of the active matrix type of the present embodiment, the first to fourth lightly doped drain regions have an equal length of 1 μm. When the on-current is insufficient, the length of the third lightly doped drain region 63 may be reduced, for example, to 0.5 μm similarly as in the liquid crystal display device of the second embodiment so that high on-current may be assured while the leak current is suppressed.

The lengths and densities of the lightly doped drain regions of the thin film transistors and the combination of them are not limited to those described above in connection with the liquid crystal display device of the second and third embodiments. This is because, if the specifications of the liquid crystal display device of the active matrix type in which thin film transistors are used are different, then the lengths and densities of the lightly doped drain regions of the thin film transistors and the combination of them should naturally be optimized accordingly. It is to be noted that, while, in the second and third embodiments described above, the channel length of the thin film transistor is set to 2.5 μm; the channel width is set to 3 μm; and the lightly doped drain length is set to 1 μm, the dimensions of the thin film transistor are not limited to the specific values. With the liquid crystal display device of the active matrix type of the second and third embodiments, since the degree of freedom in designing thin film transistors increases, also the degree of freedom in designing a picture element electrode pattern layout increases, and as a result, thin film transistors can be designed so that the picture element open area rate may be maximized. The present invention contributes also to enhancement of the open area rate of a liquid crystal display device.

By adopting the double lightly doped drain structures described in the first to third embodiments in order to manufacture liquid crystal display devices, suitable redundancy in a defect of a thin film transistor was provided, resulting in remarkable reduction of picture element defects arising from high leak current of thin film transistors. In the following, redundancy in thin film transistor defects provided by the double lightly doped drain structure will be described.

Where a single lightly doped drain thin film transistor having a single lightly doped drain region is employed as a picture element transistor, most of picture element defects arising from defects of thin film transistors are thin film transistor defect modes in which the leak current in an off-state is high. It can be considered that this arises from the fact that, at a plasma step or a rubbing step in a process of manufacturing a liquid crystal display device, static electricity flows to the picture element electrode side by way of the picture element electrode to destroy the pn junction at an end of the drain of the thin film transistor. Such leak defects arise at the rate of 1 to several picture elements per 100,000 picture elements with a liquid crystal display device wherein picture element transistors are constituted from single lightly doped drain thin film transistors, and contrivances in manufacturing steps in the past have failed to control occurrence of static electricity and consequently failed to eliminate defects completely. Further, other than a damage caused by static electricity, also high leak current arising from crystalline defects of polycrystalline silicon used in thin film transistors is one of causes, and this cause cannot be controlled by improvement in manufacturing steps.

Figure 23:
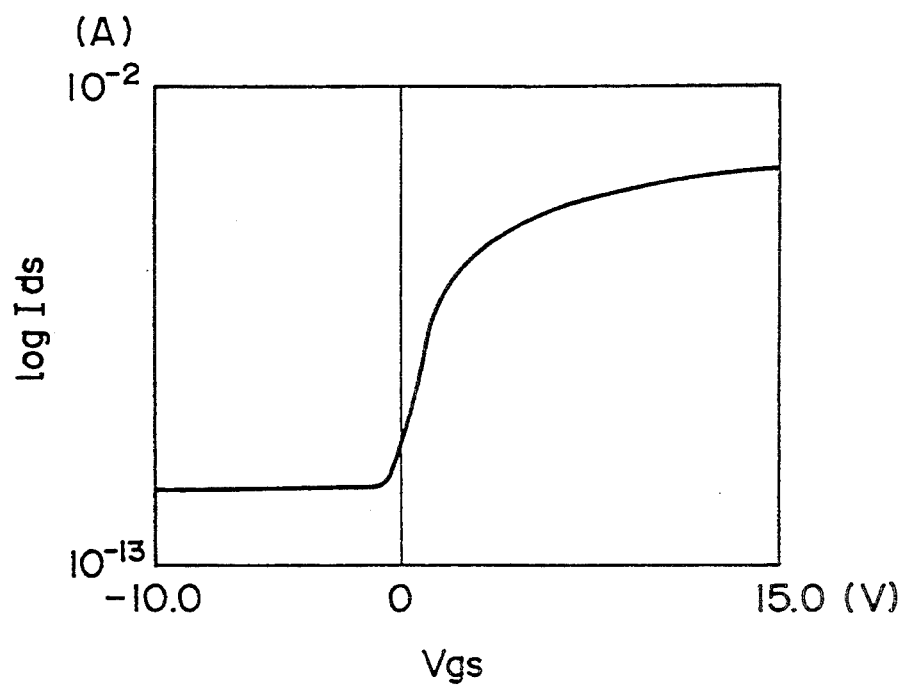
FIGS. 23 to 26 are graphs illustrating gate voltage-drain current characteristics of different thin film transistors.

In contrast, a double lightly doped drain thin film transistor can in fact eliminate a defect arising from the leak current. FIG. 23 illustrates a gate voltage-drain current ($V_{gs}$-$I_{ds}$) characteristic of a double lightly doped drain thin film transistor (TFT1) of a construction similar to that of the thin film transistor shown in FIG. 1. It is to be noted that the double lightly doped drain thin film transistor has two lightly doped drain transistor portions of 50 μm wide and 2.5 μm long connected in series and a total of four lightly doped drain regions are provided between the source region and source/drain region and one of the two channel regions between the source region and the source/drain region and between the source/drain region and drain region and the other channel region between the source/drain region and the drain region. The length of the lightly doped drain regions was 1 μm. It is to be noted that, in order to facilitate a measurement of the leak current value, an experiment was conducted with the channel width increased to 16.7 times that of the actual picture element transistor. The leak current at $V_{gs}=-6$ V and $V_{ds}=10$ V was 7.8 pA and very low. In the following description, an examination is made with reference to the leak current of 7.8 pA in this condition.

Figure 22:
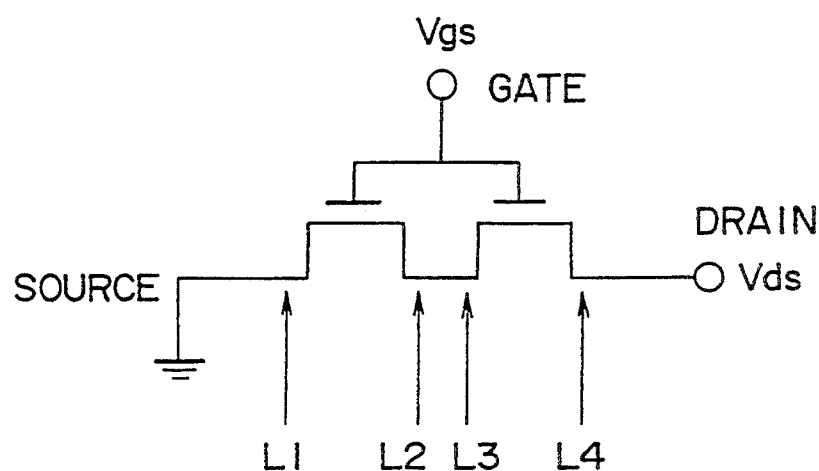
FIG. 22 is a schematic view showing the positions of lightly doped drain regions of a thin film transistor.
Figure 24:
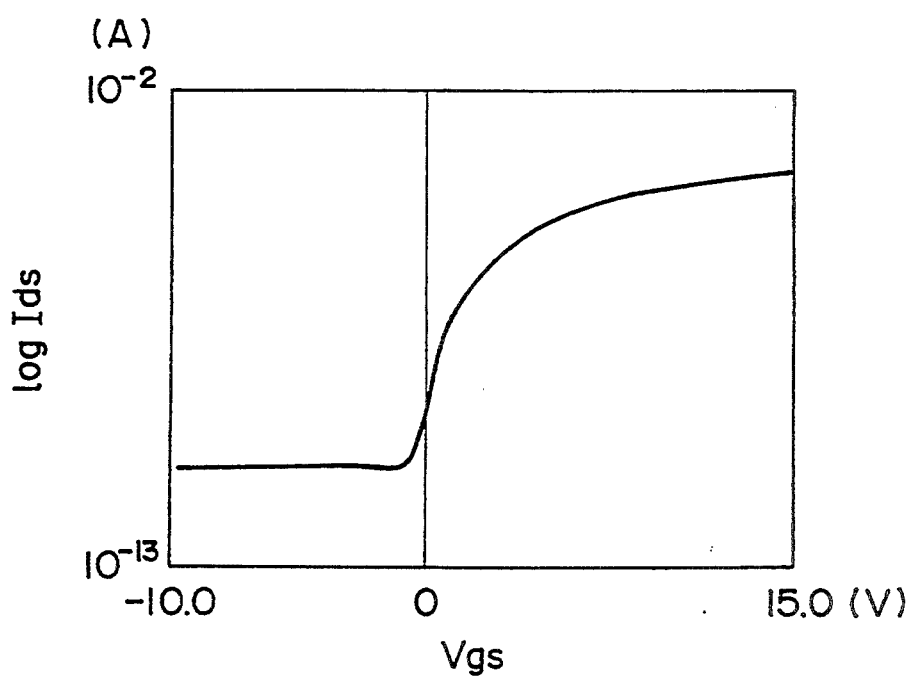
Figure 25:
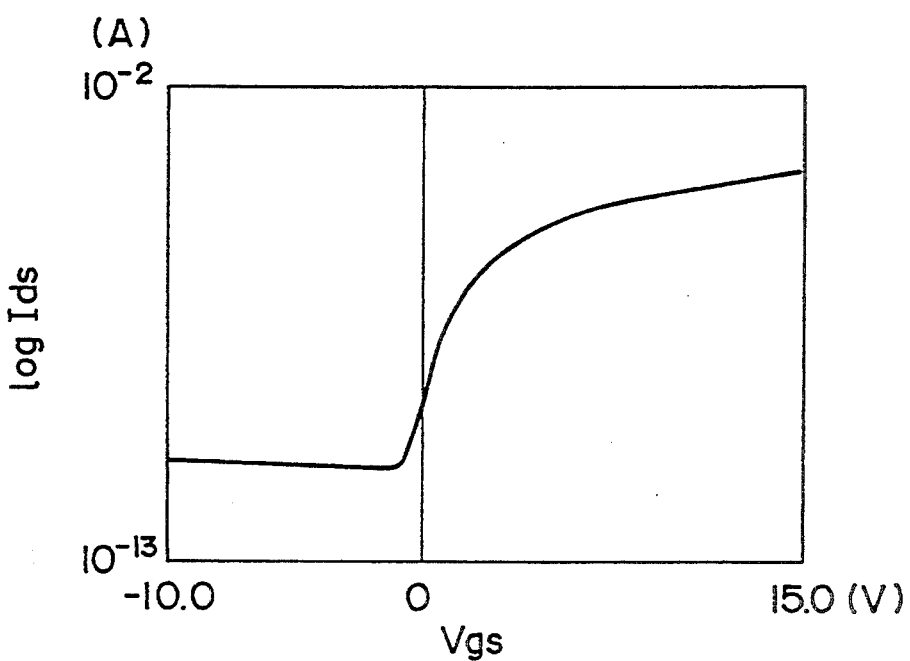

The positions of the lightly doped drain regions of the double lightly doped drain thin film transistor are numbered as L1, L2, L3 and L4 in order from the source side as shown in FIG. 22. Another double lightly doped drain thin film transistor (TFT2) with the lightly doped drain region at the position L4 in FIG. 22 omitted, that is, with the lightly doped drain region at an end of the drain omitted, was manufactured (the width and the length are same as those of the thin film transistor TFT1), and a $V_{gs}$-$I_{ds}$ characteristic was measured. A result of the measurement is illustrated in FIG. 24. It is considered that the omission of the lightly doped drain region at the position L4 simulates damage to the thin film transistor. While the leak current in the same condition as in the case of FIG. 23 increases to 27.7 pA, the leak current is suppressed sufficiently low to cause a picture element defect. Subsequently, a further double lightly doped drain thin film transistor (TFT3) with the lightly doped drain region at the end of the source, that is, at the position L1, omitted was manufactured, and while the polarity of the drain voltage of the thin film transistor was reversed, a $V_{gs}$-$I_{ds}$ characteristic of the double lightly doped drain thin film transistor was measured. A result of the measurement is illustrated in FIG. 25. It is considered that the omission here simulates damage to the junction at the end of the source of the thin film transistor of FIG. 23. The leak current in the same condition as in the case of FIG. 23 is 9.0 pA, and the difference of the leak current from that in FIG. 23 is within the range of a measurement error. Accordingly, it can be seen that the damage at the end of the source has substantially no influence upon the leak characteristic.

Subsequently, a still further double lightly doped drain thin film transistor (TFT4) with the lightly doped drain region at the position L2 omitted was manufactured, and a $V_{gs}$-$I_{ds}$ characteristic of the double lightly doped drain thin film transistor was measured. The omission simulates damage to or a crystalline defect at the position L2 of the thin film transistor. The leak current in the same condition as in the case of FIG. 23 increases a little to 14.6 pA, but this is a sufficiently low value and does not make a picture element defect. Further, a yet further double lightly doped drain thin film transistor (TFT5) with the lightly doped drain region at the position L3 omitted was manufactured, and while the polarity of the drain voltage of the thin film transistor was reversed, a $V_{gs}$-$I_{ds}$ characteristic of the thin film transistor was measured. The omission is considered to simulate damage to or a crystalline defect at the position L3. The leak current in the same condition as in the case of FIG. 23 is 6.6 pA and equal to the leak current in the case of FIG. 23 within the range of a measurement error. Thus, it can be seen that also the damage at the position L3 substantially has no influence upon the leak characteristic.

Further, a sixth double lightly doped drain thin film transistor (TFT6) with the two lightly doped drain regions at the positions L1 and L2 omitted and a seventh double lightly doped drain thin film transistor (TFT7) with the two lightly doped drain regions at the positions L3 and L4 omitted were manufactured, and a $V_{gs}$-$I_{ds}$ characteristic of each of the sixth and seventh double lightly doped drain thin film transistors was measured while the polarity of the drain voltage to the seventh double lightly doped drain thin film transistor was reversed. As a result, the former exhibited a little increase of the leak current to 13.1 pA while this is a sufficiently low value, but the former exhibited a rather high increase to 25.5 pA while this is not sufficiently high to make a picture element defect but is sufficiently low.

As a comparative example, a single lightly doped drain thin film transistor (TFT8) having lightly doped drain regions of 1 μm long and having a width of 50 μm and a length of 2.5 μm was manufactured, and leak current of it was measured. The leak current was 24.6 pA, and a similar characteristic to that of FIG. 24 was obtained. From this fact, with a double lightly doped drain transistor, if it includes a defect at an end of the drain, the other thin film transistor portion on the source side suppresses the leak current.

Further, a double lightly doped drain thin film transistor (TFT9) with the lightly doped drain regions at the positions L2 and L3 omitted was manufactured, and a $V_{gs}$-$I_{ds}$ characteristic was measured. While the leak current in the same condition as in FIG. 23 exhibits a little increase to 14.7 pA, it remains at a sufficiently low value and does not make a picture element defect. From this fact, it can be seen that, in a double lightly doped drain thin film transistor, the presence of a lightly doped drain region at an end of the drain is high in effect of suppressing the leak current and the lightly doped drain regions at the positions L2 and L3 play the role to provide some redundancy to the thin film transistor.

Figure 26:
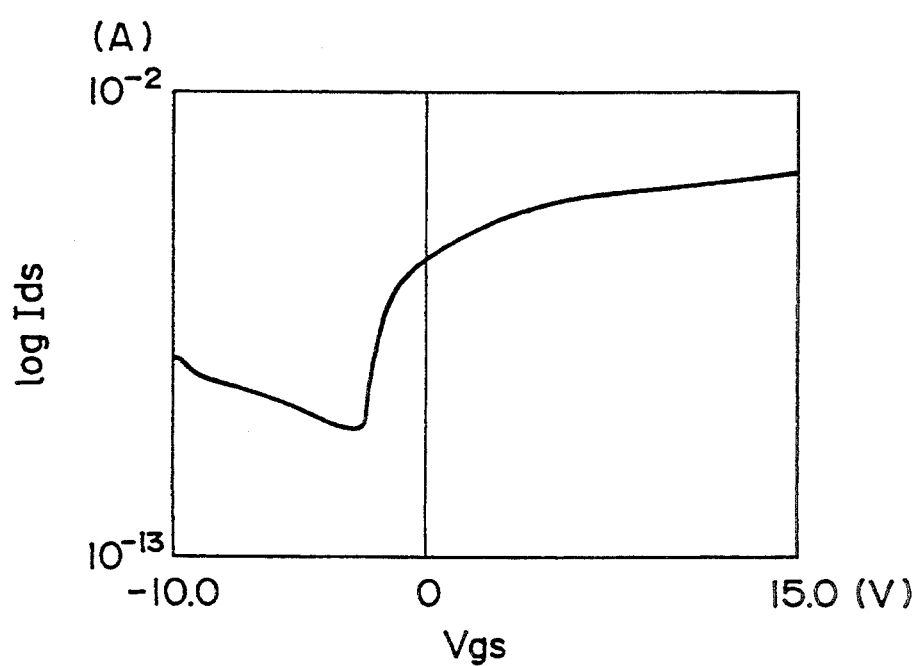

As a comparative example 2, a single lightly doped drain thin film transistor (TFT10) of the width of 50 μm and the length of 2.5 μm with the lightly doped drain region at the position 4 at an end of the drain removed was manufactured, and a $V_{gs}$-$I_{ds}$ characteristic of it was measured and shown in FIG. 26. As it can be clearly seen from FIG. 26, the leak current rises significantly, and in the same condition as in FIG. 23, the leak current is higher than 1 μA. Simultaneously, the threshold voltage Vth is shifted to the depression side by a reduction in length of the channels, making a picture element defect. As seen from FIGS. 23 and 24, in such a mode in which a picture element defect is produced with a single lightly doped drain thin film transistor, no defect is resulted with a double lightly doped drain thin film transistor. As a comparative example 3, a thin film transistor (TFT11) having no lightly doped drain region was manufactured and a $V_{gs}$-$I_{ds}$ characteristic of it was measured. The leak current of the thin film transistor having the width of 50 μm and the length of 2.5 μm was 488 pA. In this condition, a picture element defect cannot be suppressed any more. The results described above are listed up in Table 1 below.

TABLE 1

| | | LDD Structure & TFT Leak Current | | | | | |
|---|---|---|---|---|---|---|---|
| | | LDD Position | | | | Leak Current | |
| TFT | | L1 | L2 | L3 | L4 | pA | Judgment |
| 1 | Double LDD | O | O | O | O | 7.8 | Normal |
| 2 | Double LDD | O | O | O | X | 27.7 | Normal |
| 3 | Double LDD | X | O | O | O | 9.0 | Normal |
| 4 | Double LDD | O | X | O | O | 14.6 | Normal |
| 5 | Double LDD | O | O | X | O | 6.6 | Normal |
| 6 | Double LDD | X | X | O | O | 13.1 | Normal |
| 7 | Double LDD | O | O | X | X | 25.5 | Normal |
| 8 | Single LDD | O | O | — | — | 24.6 | Normal |
| 9 | Double LDD | O | X | X | O | 14.7 | Normal |
| 10 | Single LDD | O | X | — | — | 1,000 | Defect* |
| 11 | Double Gate | X | X | X | X | 488 | Defect* |

*Picture element defect

In Table 1 above, the mark at the position of the lightly doped drain represents presence or absence of a lightly doped drain region at a corresponding one of the positions L1 to L4 in FIG. 22. In particular, the mark O represents presence of a lightly doped drain region at the position, but the mark X represents absence of a lightly doped drain region at the position, and the mark — represents absence of a thin film transistor at the position since the thin film transistor arrangement includes a single lightly doped drain thin film transistor. In any single lightly doped drain thin film transistor arrangement, the position L2 makes a drain terminal of the thin film transistor arrangement. In the judgment, "Normal" indicates that no picture element defect is provided even if the thin film transistor structure is employed as a picture element thin film transistor, and "Defect", that is, "Picture element defect", indicates that the leak defect of the thin film transistor structure makes a picture element defect. From Table 1, it can be seen that such a defect mode at the drain terminal that makes a picture element defect with a single lightly doped drain thin film transistor structure does not make a defect with a double lightly doped drain thin film transistor structure.

As apparent from the foregoing description, it can be seen that no picture element is provided if at least one of two thin film transistor portions which constitute a double lightly doped drain thin film transistor operates normally. Since the probability that a thin film transistor may either be damaged at some manufacturing step such that the leak current increases or have a crystalline defect which results in increase of the leak current is one to several picture elements per 100,000 picture elements, that is, on the order of $10 \times 10^{-5}$, the probability that a pair of thin film transistors are damaged simultaneously or have crystalline defects which result in increase of the leak current simultaneously so that they may make a picture element defect is $10^{-10}$, or in other words, substantially no picture element defect will be provided. With a liquid crystal display device manufactured using a double lightly doped drain thin film transistor structure according to the present invention, picture element defects, which each arises from leak current of a thin film transistor, are produced, and it is apparent that the effect of redundancy of the double lightly doped drain thin film transistor structure is very significant.

With multi-gate thin film transistors having no lightly doped drain region such as a double gate thin film transistor such as, for example, the thin film transistor TFT11, no redundancy in a thin film transistor defect can be obtained. This is because conventional multi-gate thin film transistors have been invented since a single thin film transistor cannot suppress leak current sufficiently and the requirement that "the leak current is sufficiently low using a single thin film transistor" is not satisfied.

Redundancy constructions have conventionally been adopted in order to assure a high yield in manufacture. For example, such means as provision of a plurality of thin film transistors for a single picture element or provision of an extra thin film transistor have been taken. However, those means are employed but reluctantly in order to assure an initial yield in manufacture to some degree and have, in compensation for the redundancy, several drawbacks including an increase in number of manufacturing steps, disconnection of a wiring line, an increase in number of connecting steps and complication in circuitry. In contrast, the multi-gate lightly doped drain thin film transistor structure of the present invention has no such drawbacks at all. In particular, the number of manufacturing steps is not increased and there is no necessity of repairing a defect picture element or modifying a driver circuit. As described so far, the advantages of redundancy achieved by the multi-gate lightly doped drain thin film transistor structure are very significant.

Having now fully described the invention, it will be apparent to one of ordinary skill in the art that many changes and modifications can be made thereto without departing from the spirit and scope of the invention as set forth herein.

What is claimed is:

1. A liquid crystal display device, comprising:
   a first substrate;
   a plurality of picture element electrodes arranged in a matrix on the first substrate, each picture element electrode being associated with a switching element which comprises a plurality of thin film transistors connected in series, gate electrodes of the plurality of thin film transistors being electrically connected to each other, the thin film transistors having lightly doped regions between a source/drain region and a channel region, the lightly doped region being of the same conductivity type to that of the source/drain region, each of the thin film transistors having a channel length no longer than 5 μm;
   a second substrate opposed to the first substrate and having an electrode on an inner surface thereof; and
   a liquid crystal layer disposed between the first and second substrates.

2. A liquid crystal display device as claimed in claim 1, wherein said thin film transistors have a first lightly doped region between source and channel regions, and a second lightly doped region between channel and drain regions.

3. A liquid crystal display device as claimed in claim 1, wherein said switching element comprises a pair of thin film transistors connected in series.

4. A liquid crystal display device as claimed in claim 3, wherein one of said thin film transistors has a first lightly doped region only between source and channel regions, and the other thin film transistor has a second lightly doped region only between drain and channel regions.

5. A liquid crystal display device as claimed in claim 3, wherein said pair of thin film transistors have two lightly doped regions at both ends of source/drain region.

6. A liquid crystal display device as claimed in claim 3, wherein said pair of thin film transistors have a first lightly doped region at an end of the drain region and a second lightly doped region at an end of the source side of the source/drain region.

7. A liquid crystal display device as claimed in claim 1, wherein said plurality of thin film transistors have a plurality of lightly doped regions, at least one of which has a different doping characteristic than that of another lightly doped regions.

8. A liquid crystal display device as claimed in claim 7, wherein said lightly doped region having a different doping characteristic is a region arranged the closest to the picture element electrode and is the region having a lower doping characteristic than another lightly doped region.

9. A liquid crystal display device according to claim 1, wherein said lightly doped drain region comprises As+ ion or P+ ion.

10. A liquid crystal display device according to claim 9, wherein a dopant concentration of the lightly doped drain region is in the range of $0.5 \times 10^{13}$ to $1.5 \times 10^{13}/cm^2$.

11. A liquid crystal display device according to claim 1, wherein said lightly doped drain region comprises B+ ion.

12. A liquid crystal display device according to claim 11, wherein a dopant concentration of the lightly doped drain region is in the range of $0.1 \times 10^{13}$ to $2.0 \times 10^{-}/cm^2$.

13. A liquid crystal display device according to claim 1, wherein said plurality of thin film transistors have a plurality of lightly doped regions with at least one region being different than the other lightly doped regions.

14. A liquid crystal display device according to claim 13, wherein said one region has a different length.

15. A liquid crystal display device according to claim 14, wherein said lightly doped region having a different length is a region arranged the closest to the picture element electrode and is the region having a length longer than the other regions.

16. A liquid crystal display device according to claim 13, wherein said one region has a different doping characteristic.

17. A liquid crystal display device according to claim 16, wherein said lightly doped region having a different doping characteristic is a region arranged the closest to the picture element electrode and is the region having a lower doping characteristic than the other lightly doped regions.-IN 18. A liquid crystal display device, comprising:
a first substrate;
a plurality of picture element electrodes arranged in a matrix on the first substrate, each picture element electrode being associated with a switching element which comprises a plurality of thin film transistors connected in series, gate electrodes of the plurality of thin film transistors being electrically connected to each other, the thin film transistors having a plurality of lightly doped regions between a source/drain region and a channel region, at least one of which regions has a different length than that of another lightly doped region, the lightly doped region being of the same conductivity type to that of the source/drain region;
a second substrate opposed to the first substrate and having an electrode on an inner surface thereof; and
a liquid crystal layer disposed between the first and second substrates.

19. A liquid crystal display device as claimed in claim 18, wherein said lightly doped region having a different length is a region arranged the closest to the picture element electrode and is the region having a length longer than another region.

* * * * *